United States Patent
Shin et al.

(10) Patent No.: US 9,324,420 B2
(45) Date of Patent: Apr. 26, 2016

(54) METHOD OF ESTIMATING DETERIORATION STATE OF MEMORY DEVICE AND RELATED METHOD OF WEAR LEVELING

(71) Applicant: SAMSUNG ELECTRONICS CO., LTD., Suwon-Si, Gyeonggi-Do (KR)

(72) Inventors: Beom-Kyu Shin, Seongnam-Si (KR); Ung-Hwan Kim, Seongnam-Si (KR); Jun-Jin Kong, Yongin-Si (KR); Eun-Cheol Kim, Seongnam-Si (KR); Dong-Min Shin, Seoul (KR); Myung-Kyu Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/446,347

(22) Filed: Jul. 30, 2014

(65) Prior Publication Data

US 2015/0043282 A1 Feb. 12, 2015

(30) Foreign Application Priority Data

Aug. 9, 2013 (KR) .......................... 10-2013-0094886

(51) Int. Cl.

| | |
|---|---|
| *G11C 16/06* | (2006.01) |
| *G11C 11/56* | (2006.01) |
| *G11C 16/34* | (2006.01) |
| *G11C 16/04* | (2006.01) |
| G11C 16/26 | (2006.01) |
| G06F 12/00 | (2006.01) |

(52) U.S. Cl.
CPC ........ *G11C 11/5642* (2013.01); *G11C 16/0483* (2013.01); *G11C 16/3495* (2013.01); *G06F 12/00* (2013.01); *G11C 16/26* (2013.01)

(58) Field of Classification Search
CPC .......... G11C 16/0483; G11C 11/5642; G11C 16/26; G11C 16/28; G11C 13/004; G11C 29/026; G11C 13/0004; G06F 12/00; G06F 11/00
USPC ............. 365/185.21, 185.18, 185.23, 185.17, 365/185.24

See application file for complete search history.

(56) References Cited

U.S. PATENT DOCUMENTS

| | | | |
|---|---|---|---|
| 6,850,443 | B2 | 2/2005 | Lofgren et al. |
| 7,353,325 | B2 | 4/2008 | Lofgren et al. |
| 7,694,066 | B2 | 4/2010 | Sakui et al. |
| 7,801,254 | B1 | 9/2010 | Burd et al. |
| 7,904,783 | B2 | 3/2011 | Brandman et al. |
| 8,015,346 | B2 | 9/2011 | Chen et al. |
| 8,385,126 | B2 * | 2/2013 | Shiino et al. ............. 365/185.18 |
| 9,001,587 | B2 * | 4/2015 | Eun et al. ................. 365/185.21 |

(Continued)

FOREIGN PATENT DOCUMENTS

KR 10-2013-0006472 1/2013

*Primary Examiner* — David Lam
(74) *Attorney, Agent, or Firm* — Volentine & Whitt, PLLC

(57) ABSTRACT

A method of estimating a deterioration state of a memory device comprises reading data from selected memory cells connected to a selected wordline of a memory cell array by applying to the selected wordline a plurality of distinct read voltages having values corresponding to at least one valley of threshold voltage distributions of the selected memory cells, generating quality estimation information indicating states of the threshold voltage distributions using the data read from the selected memory cells, and determining a deterioration state of a storage area including the selected memory cells based on the generated quality estimation information.

19 Claims, 18 Drawing Sheets

(56) References Cited

U.S. PATENT DOCUMENTS

| | | |
|---|---|---|
| 2010/0251039 A1 | 9/2010 | Hirohata et al. |
| 2011/0197045 A1 | 8/2011 | Okamoto |
| 2011/0235434 A1 | 9/2011 | Byom et al. |
| 2011/0238897 A1 | 9/2011 | Abe |
| 2011/0252289 A1 | 10/2011 | Patapoutian et al. |
| 2012/0079353 A1 | 3/2012 | Liikanen et al. |
| 2012/0096212 A1 | 4/2012 | Harriman |
| 2012/0163074 A1 | 6/2012 | Franca-Neto et al. |
| 2012/0166897 A1 | 6/2012 | Franca-Neto et al. |
| 2012/0236638 A1 | 9/2012 | Weingarten et al. |
| 2012/0268994 A1 | 10/2012 | Nagashima |
| 2013/0007566 A1 | 1/2013 | Shalvi et al. |
| 2013/0031443 A1 | 1/2013 | Oh et al. |

\* cited by examiner

METHOD OF ESTIMATING DETERIORATION STATE OF MEMORY DEVICE AND RELATED METHOD OF WEAR LEVELING

CROSS-REFERENCE TO RELATED APPLICATIONS

This application claims priority under 35 USC 119 to Korean Patent Application No. 10-2013-0094886 filed on Aug. 9, 2013, the disclosure of which is hereby incorporated by reference in its entirety.

BACKGROUND OF THE INVENTION

The inventive concept relates generally to memory technologies. More particularly certain embodiments of the inventive concept relate to a method of estimating a deterioration state of a memory device and a wear leveling method using the method.

Memory devices tend to deteriorate according to usage, environmental conditions, and other factors. Such deterioration may result in loss of stored data. To avoid such data loss, researchers have developed various way to estimate and control the level of deterioration of a memory device, such as monitoring memory access operations and wear leveling. In general, the performance of the estimation techniques depends on their accuracy. Accordingly, there is a general need for improved estimation techniques for determining the level of deterioration of memory devices.

SUMMARY OF THE INVENTION

In one embodiment of the inventive concept, a method of estimating a deterioration state of a memory device comprises reading data from selected memory cells connected to a selected wordline of a memory cell array by applying to the selected wordline a plurality of distinct read voltages having values corresponding to at least one valley of threshold voltage distributions of the selected memory cells; generating quality estimation information indicating states of the threshold voltage distributions using the data read from the selected memory cells; and determining a deterioration state of a storage area including the selected memory cells based on the generated quality estimation information.

In another embodiment of the inventive concept, a method of performing wear leveling in a memory system comprises determining a number of memory cells in each of multiple threshold voltage sections defined by a plurality of read voltages set to generate soft-decision data; where a threshold voltage distribution width level according to read voltage displacement determined using the determined number of memory cells is higher than a first decision reference value, determining a deterioration state of the memory cells to be a first deterioration state; detecting, based on a result of a decoding process using the soft-decision data, bits whose errors are corrected in the threshold voltage sections defined by the plurality of read voltages; where a number of bits whose errors are corrected corresponding to a memory cell having a threshold voltage not included in a section between a minimum level and a maximum level of the plurality of read voltages from among the detected bits whose errors are corrected is higher than a second decision reference value, determining the deterioration state to be a second deterioration state; and transferring data stored in a storage area whose deterioration state is determined to be at least one of the first and second deterioration states to another storage area whose deterioration state is lower than a threshold level.

In yet another embodiment of the inventive concept, a method of performing wear leveling in a memory system comprises reading data from a memory device by applying to selected memory cells in a designated storage area a plurality of read voltages set to generate soft-decision data; generating first type quality estimation information using the data read from the memory device; determining a first decision reference value based on the first type quality estimation information; comparing information in the first type quality estimation information with the first decision reference value; where it is determined that the information in the first type quality estimation information is higher than the first decision reference value, determining a deterioration state of the designated storage area to be a first deterioration state, and otherwise generating second type quality estimation information using the data read from the memory device, comparing the second type quality estimation information with a second decision reference value, and upon determining that the second type quality estimation information is higher than the second decision reference value, determining the deterioration state of the designated storage area to be the second deterioration state; and transferring the data stored in the designated storage area determined to be in the first or second deterioration state to another storage area of the memory device having a deterioration state lower than a threshold level.

These and other embodiments of the inventive concept can potentially improve the reliability and performance of memory devices through estimation of deterioration and appropriate wear leveling.

BRIEF DESCRIPTION OF THE DRAWINGS

The drawings illustrate selected embodiments of the inventive concept. In the drawings, like reference numbers indicate like features.

DETAILED DESCRIPTION

Embodiments of the inventive concept are described below with reference to the accompanying drawings. These embodiments are presented as teaching examples and should not be construed to limit the scope of the inventive concept.

The terms used in this written description are intended to describe particular embodiments and not to limit the inventive concept. An expression used in the singular encompasses the expression of the plural, unless it has a clearly different meaning in the context. In the present specification, terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

Unless otherwise defined, all terms (including technical and scientific terms) used herein have the same meaning as commonly understood by one of ordinary skill in the art. Terms such as those defined in commonly used dictionaries should be interpreted as having a meaning that is consistent with their meaning in the context of the relevant art and will not be interpreted in an idealized or overly formal sense unless expressly so defined herein.

As used herein, the term "and/or" includes any and all combinations of one or more of the associated listed items. Expressions such as "at least one of," when preceding a list of elements, modify the entire list of elements and do not modify the individual elements of the list.

Figure 1:
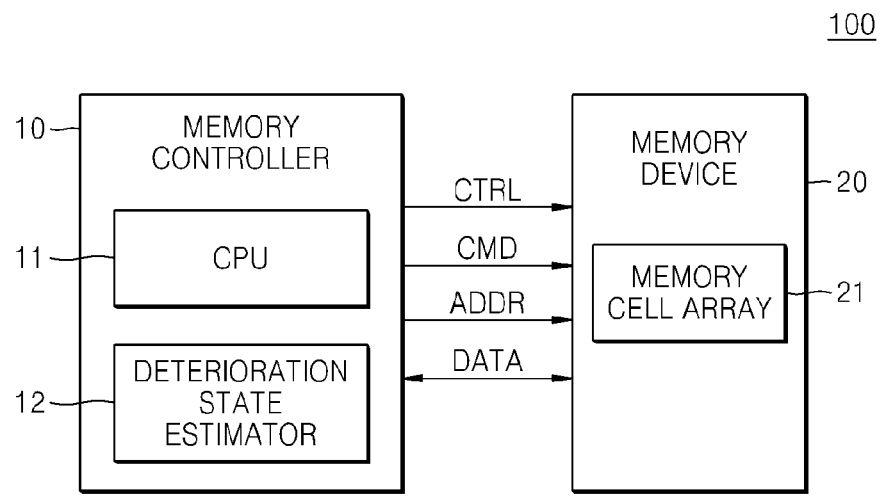
FIG. 1 is a block diagram of a memory system according to an embodiment of the inventive concept.

FIG. 1 is a block diagram of a memory system 100 according to an embodiment of the inventive concept.

Referring to FIG. 1, memory system 100 comprises a memory controller 10 and a memory device 20. Memory controller 10 controls memory device 20, typically by providing an address signal ADDR, a command signal CMD, and a control signal CTRL to memory device 20 to control a program (or write) operation, a reading process, and an erase operation of memory device 20.

Memory device 20 comprises a memory cell array 21, which comprises a plurality of memory cells disposed in regions where a plurality of wordlines and a plurality of bitlines cross each other. In some embodiments, the memory cells may be flash memory cells, and memory cell array 21 may be a NAND flash memory cell array or a NOR flash memory cell array. Hereinafter, one or more embodiments of the inventive concept are described for a case where the memory cells are flash memory cells. Alternatively, the memory cells may be resistive memory cells, such as resistive random access memory (RRAM) cells, phase change RAM (PRAM) cells, or magnetic RAM (MRAM) cells.

First, a method of estimating the deterioration state of memory device 20, according to an embodiment of the inventive concept, will be described with reference to FIG. 22.

Figure 22:
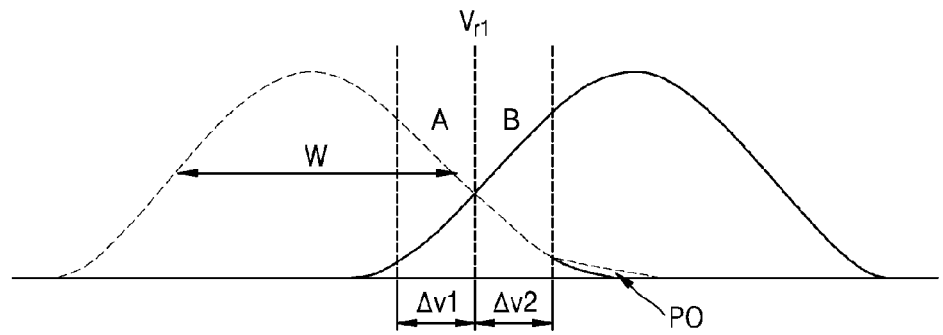
FIG. 22 is a diagram showing threshold voltage distributions of memory cells, for describing a method of estimating the deterioration state of a memory device, according to an embodiment of the inventive concept.

FIG. 22 is a diagram showing threshold voltage distributions of memory cells, according to an embodiment of the inventive concept.

Referring to FIG. 22, an error correcting ability deteriorates as a width W of distribution of threshold voltages increases. Also, a malignant (i.e., uncorrectable) error is more likely to occur as a number of memory cells in an outermost region PO of the distribution of the threshold voltages increases. For example, a deterioration state of a storage area of memory device 20 is determined by estimating states of distributions of threshold voltages using numbers of memory cells in threshold voltage sections A and B defined by read voltages [(Vr1−ΔV1 second read voltage), Vr1, and (Vr1+ΔV2 third read voltage)] for generating soft-decision data. Here, ΔV1 denotes a first offset voltage and ΔV2 denotes a second offset voltage. As an example, ΔV1 and ΔV2 may be the same. Alternatively, ΔV1 and ΔV2 may be different.

Alternatively, the deterioration state of the storage area of memory device 20 may be determined based on a weight of bits corresponding to a memory cell in the outermost region PO of the distribution of the threshold voltages, from among bits whose errors are corrected according to a soft-decision decoding process.

The method of estimating the deterioration state of memory device 20 may be performed by memory controller 10.

Referring again to FIG. 1, memory controller 10 comprises a central processing unit (CPU) 11 and a deterioration state estimator 12. CPU 11 controls overall operations of memory system 100. CPU 11 controls memory system 100 to decode a command received from a host and to perform an operation according to a decoding result. In detail, CPU 11 may control memory system 100 to perform the method of estimating a deterioration state of a memory device or a wear leveling method in a memory system, according to one or more embodiments of the inventive concept, which will be described below with reference to FIGS. 10 through 21.

Deterioration state estimator 12 estimates states of threshold voltage distributions with respect to memory cells using data read from memory device 20 during a soft-decision reading process under control of CPU 11, and it determines a deterioration state based on the estimation. For example, the determining of the deterioration state may be performed in a sector, page, or block unit.

For example, deterioration state estimator 12 determines a number of memory cells in each of threshold voltage sections defined by a plurality of read voltages set to generate soft-decision data using data read from a selected wordline of memory device 20, and if a threshold voltage distribution width level according to read voltage displacement determined using the determined number of memory cells is higher than a first decision reference value, determines the deterioration state to be a first deterioration state.

As another example, deterioration state estimator 12 detects bits whose errors are corrected in the threshold voltage sections defined by the plurality of read voltages to generate the soft-decision data based on a result of a decoding process using the soft-decision data, and if a number of bits whose errors are corrected corresponding to a memory cell having a threshold voltage not included in a section between a minimum level and a maximum level of the plurality of read voltages, from among the detected bits whose errors are detected, is higher than a second decision reference value, determines the deterioration state to be a second deterioration state. The determining of the deterioration state to be the first or second deterioration state by deterioration state estimator 12 will be described in further detail later.

CPU 11 controls memory system 100 to transfer data stored in a storage area whose deterioration state is determined to be at least one of the first and second deterioration states by deterioration state estimator 12 to another storage area whose deterioration state is lower than a threshold level. Such transferring may be performed in a block unit. Alternatively, the transferring may be performed in a page unit.

Figure 2:
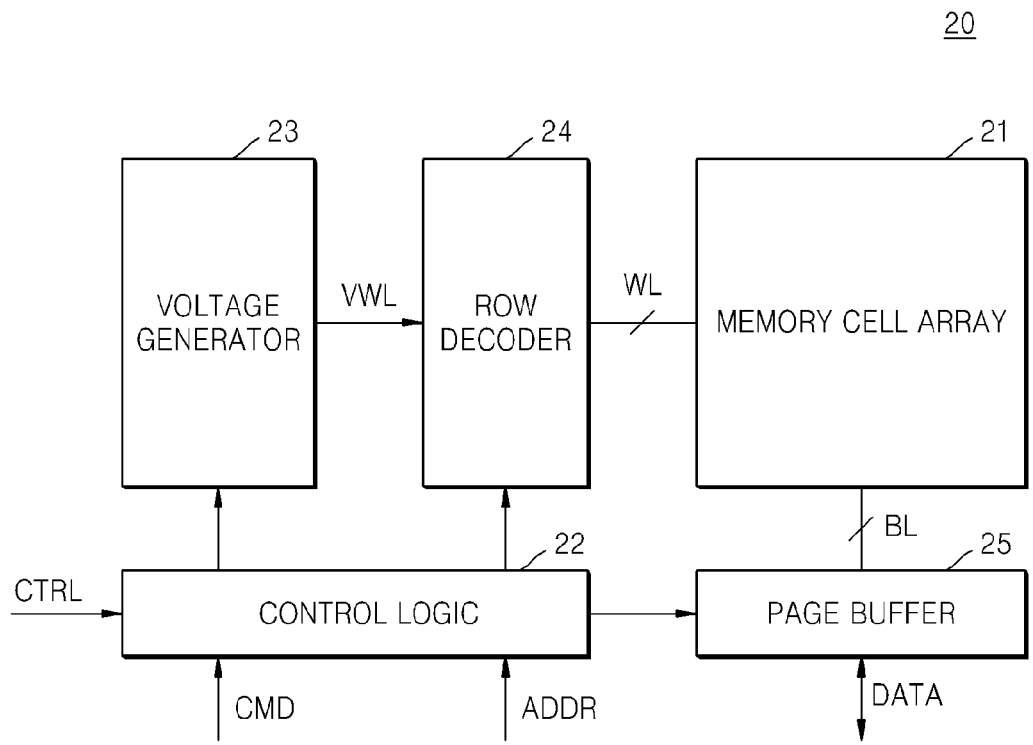
FIG. 2 is a block diagram of a memory device in the memory system of FIG. 1, according to an embodiment of the inventive concept.

FIG. 2 is a block diagram of memory device 20 in memory system 100 of FIG. 1.

Referring to FIG. 2, memory device 20 may include memory cell array 21, a control logic 22, a voltage generator 23, a row decoder 24, and a page buffer 25.

Control logic 22 may output various control signals for writing or reading data on or from memory cell array 21 based on the command signal CMD, address signal ADDR, and control signal CTRL received from memory controller 10. A control signal output from control logic 22 may be transferred to voltage generator 23, row decoder 24, and page buffer 25.

Voltage generator 23 generates a driving voltage VWL for driving a plurality of wordlines WL based on a control signal received from control logic 22. The driving voltage VWL may be a write voltage (or a program voltage), a read voltage, an erase voltage, or a pass voltage, for example.

Row decoder 24 activates some of the plurality of wordlines WL based on a row address. For instance, during a reading process, row decoder 24 may apply a read voltage to a selected wordline and a pass voltage to an unselected wordline. During a write operation, row decoder 24 may apply a write voltage to a selected wordline and a pass voltage to an unselected wordline.

Page buffer 25 is connected to memory cell array 21 through a plurality of bitlines BL. Page buffer 25 temporarily stores data to be recorded in memory cell array 21 or data read from memory cell array 21.

Figure 3:
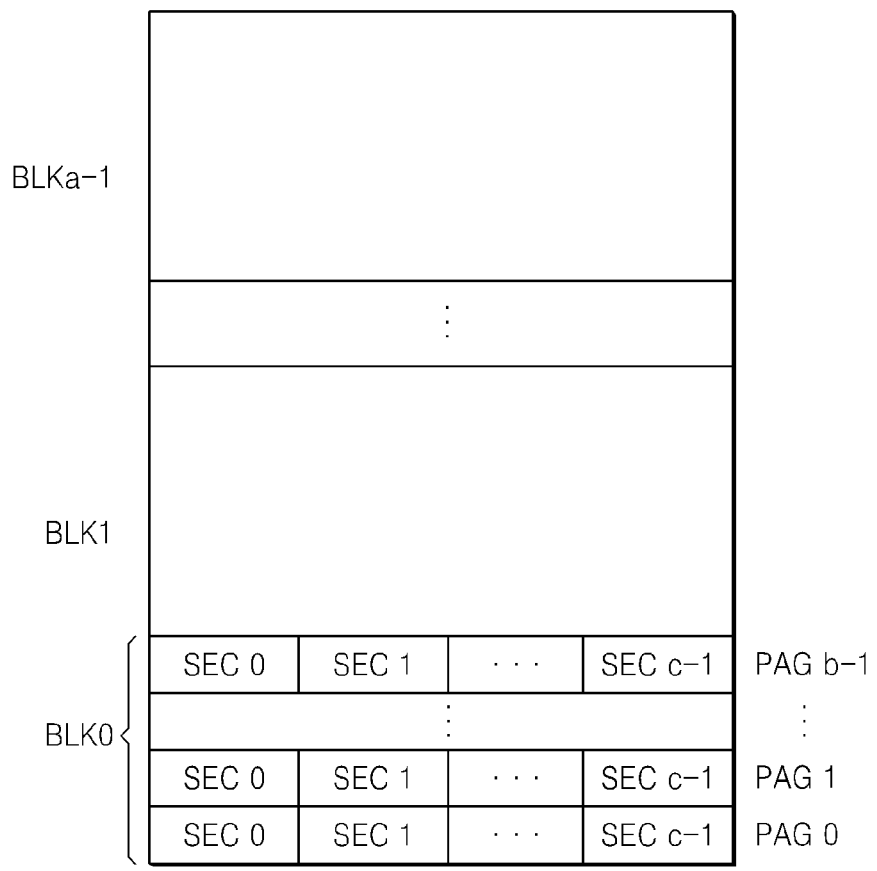
FIG. 3 is a diagram of a memory cell array in the memory device of FIG. 2, according to an embodiment of the inventive concept.

FIG. 3 is a diagram of memory cell array 21 in memory device 20 of FIG. 2, according to an embodiment of the inventive concept.

Referring to FIG. 3, memory cell array 21 may be a flash memory cell array. Memory cell array 21 comprises "a" ($a \geq 2$) blocks BLK0 through BLKa-1, where of the blocks comprises "b" ($b \geq 2$) pages PAG0 through PAGb-1, and each of the pages comprises "c" ($c \geq 2$) sectors SEC0 through SECc-1. In FIG. 3, for convenience of illustration, pages PAG0 through PAGb-1 and sectors SEC0 through SECc-1 of block BLK0 are shown, but other blocks BLK1 through BLKa-1 may have the same structure as the BLK0.

Figure 4:
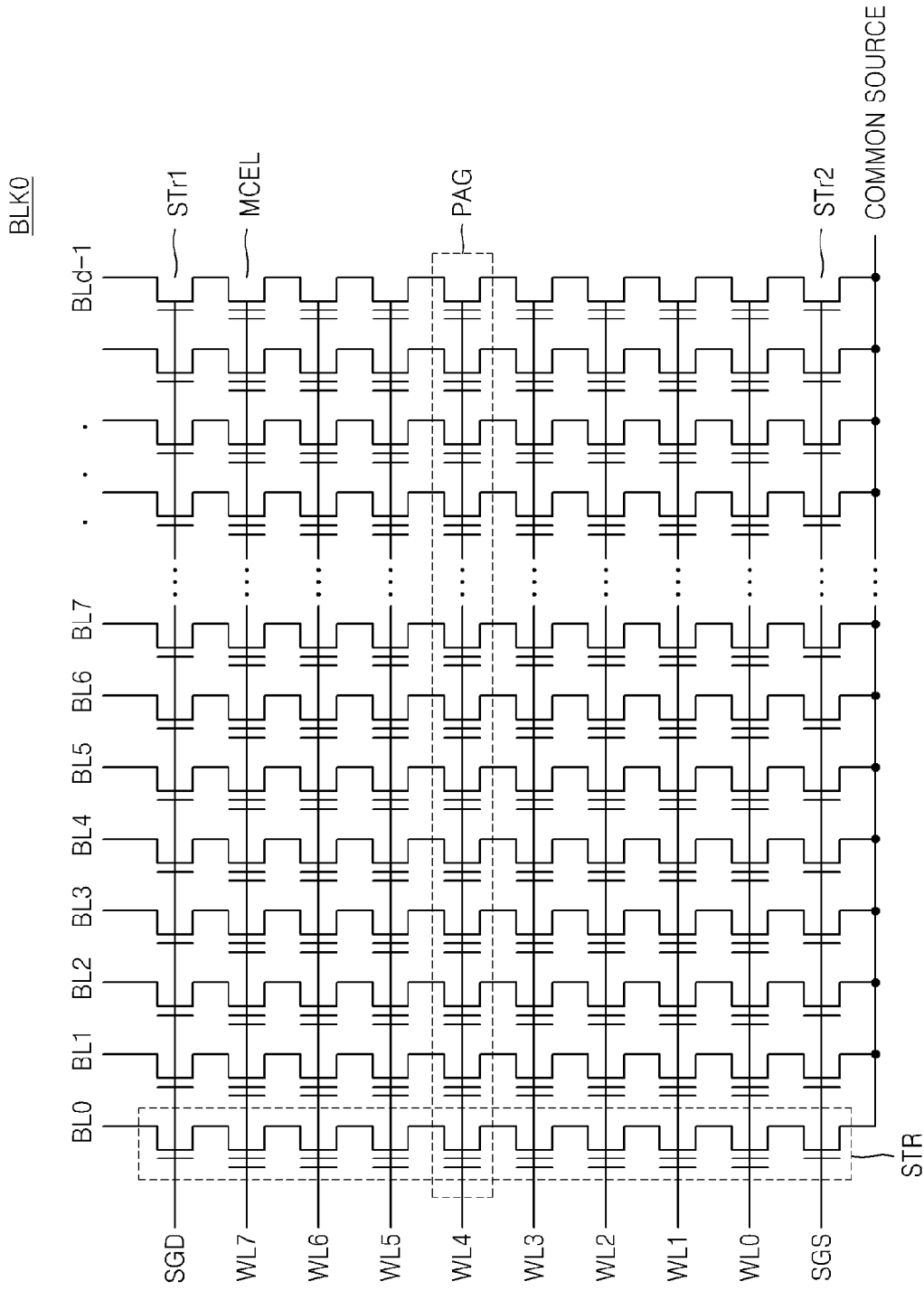
FIG. 4 is a circuit diagram of a memory block in the memory cell array of FIG. 3, according to an embodiment of the inventive concept.

FIG. 4 is a circuit diagram of block BLK0 in memory cell array 21 of FIG. 3, according to an embodiment of the inventive concept. Memory cell array 21 of FIG. 4 is a memory cell array of a NAND flash memory. Each of blocks BLK0 through BLKa-1 of FIG. 3 may be realized similar to block BLK0 of FIG. 4.

Referring to FIG. 4, each of blocks BLK0 through BLKa-1 may include, in a direction of bitlines BL0 through BLd-1, "d" ($d \geq 2$) strings STR in which eight memory cells MCEL are connected in series. Each string STR comprises a drain selecting transistor Str1 and a source selecting transistor Str2 respectively connected to two ends of the memory cells MCEL that are connected in series.

In the NAND flash memory device of FIG. 4, an erase operation is performed in a block unit and a program operation is performed in a page unit corresponding to each of wordlines WL0 through WL7. In FIG. 4, eight pages PAG are included for the eight wordlines WL0 through WL7 in one block. Alternatively, blocks BLK0 through BLKa-1 of memory cell array 21 may include different numbers of memory cells MCEL and pages PAG from those of FIG. 4. Also, memory device 20 of FIGS. 1 and 2 may include a plurality of memory cell arrays performing the same operations and having the same structure as memory cell array 21 described above.

Figure 5:
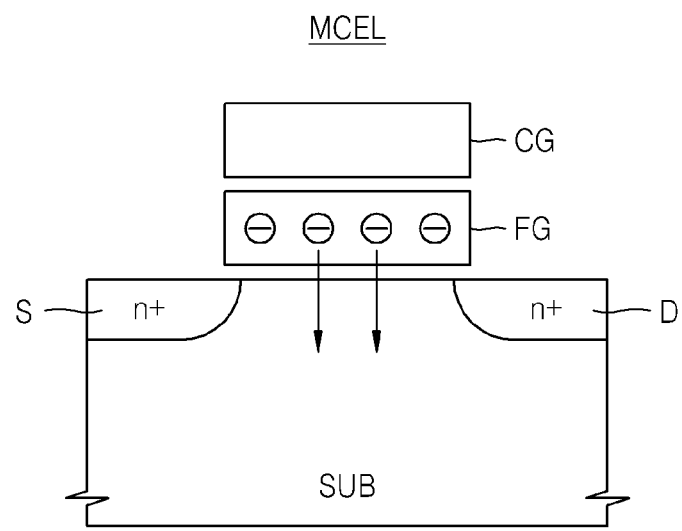
FIG. 5 is a cross-sectional view of a memory cell in the memory block of FIG. 4, according to an embodiment of the inventive concept.

FIG. 5 is a cross-sectional view of a memory cell MCEL in block BLK0 of FIG. 4, according to an embodiment of the inventive concept.

Referring to FIG. 5, a source S and a drain D are formed on a substrate SUB, and a channel region is disposed between source S and drain D. A floating gate FG is formed on the channel region, and an insulating layer, such as a tunneling insulating layer may be disposed between the channel region and floating gate FG. A control gate CG is formed on floating gate FG, and an insulating layer, such as a blocking insulating layer may be disposed between floating gate FG and control gate CG. Voltages required for programming, erasing, and reading processes on memory cell MCEL may be applied to the substrate SUB, source S, drain D, and control gate CG.

In a flash memory device, data stored in memory cell MCEL may be read according to classification of a threshold voltage Vth of memory cell MCEL. Threshold voltage Vth of memory cell MCEL may be determined by an amount of electrons stored in floating gate FG. In detail, threshold voltage Vth of memory cell MCEL increases as the amount of electrons in floating gate FG increases.

The electrons stored in floating gate FG of memory cell MCEL may leak in a direction indicated by arrows due to various reasons, and thus threshold voltage Vth of the memory cell may vary. For example, the electrons may leak due to abrasion of memory cell MCEL. In detail, when an access operation, such as a programming, erasing, or reading process, is repeatedly performed on memory cell MCEL, the insulating layer between the channel region and floating gate FG may be worn out, and thus the electrons stored in floating gate FG may leak. Alternatively, the electrons may leak due to a high temperature stress or a temperature difference during a programming/reading process. Such a leakage of electrons causes deterioration of the flash memory device.

In the flash memory device, writing and reading of data are performed in a page unit, and electric erasing of data is performed in a block unit. Also, before writing, a block needs to be electrically erased. Thus, overwriting is not possible.

In a memory device incapable of overwriting, a user is unable to write data in a desired physical region. Thus, when read or write access is requested by a host, an address converting operation, wherein a logical address from the host is converted to a physical address where data is stored or is to be stored, is required to be performed.

The address converting operation performed by memory system 100 will be described in detail with reference to FIG. 6.

Figure 6:
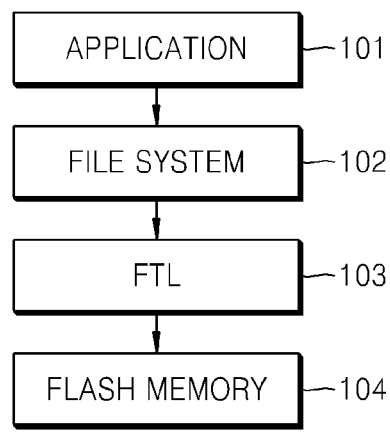
FIG. 6 is a block diagram of a system architecture of the memory system of FIG. 1, according to an embodiment of the inventive concept.

FIG. 6 is a block diagram of a system architecture of memory system 100 of FIG. 1, according to an embodiment of the inventive concept. Memory device 20 in memory system 100 of FIG. 6 is a flash memory device.

Referring to FIG. 6, memory system 100 has a hierarchical system architecture comprising an application 101, a file system 102, a flash translation layer (FTL) 103, and a flash memory 104. Flash memory 104 is a physical structure, which can be provided by memory device 20 of FIG. 2.

Application 101 comprises software for processing user data. Application 101 may be, for instance, document processing software such as Word processor, calculating software, or a document viewer such as a web browser. Application 101 processes the user data in response to an input of a user, and transmits a command for storing the processed user data in flash memory 104 to file system 102.

File system 102 comprises a structure or software used to store user data in flash memory 104. File system 102 assigns a logical address in which user data is to be stored, in response to a command from application 101. Examples of file system 102 include a file allocation table (FAT) file system and an NT file system (NTFS).

In FTL 103, the logical address received from file system 102 is converted into a physical address for a reading/writing operation in flash memory 104. FTL 103 converts the logical address to the physical address using a mapping table. An address mapping method may use a page mapping or block mapping method. The page mapping method performs an address mapping operation in a page unit and the block mapping method performs an address mapping operation in a block unit. Alternatively, a mixed mapping method in which the page and block mapping methods are mixed may be used. The physical address denotes a data storage location in flash memory 104.

Figure 7:
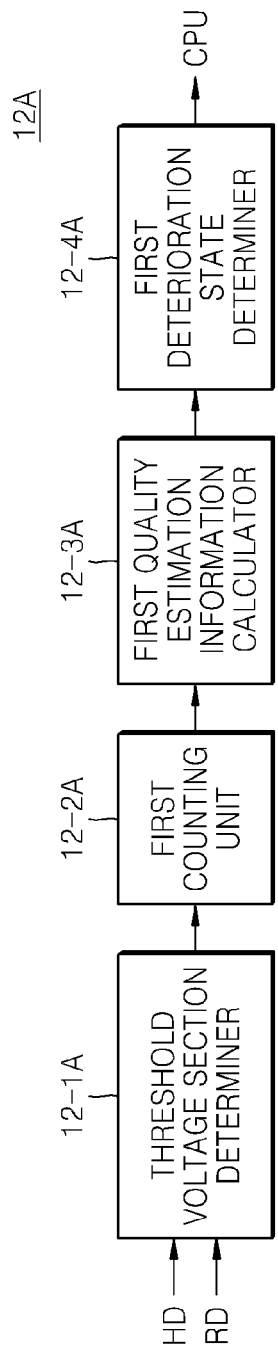
FIG. 7 is a block diagram of a deterioration state estimator in a memory controller of FIG. 1, according to an embodiment of the inventive concept.

FIG. 7 is a block diagram of deterioration state estimator 12 in memory controller 10 of FIG. 1, according to an embodiment of the inventive concept.

Referring to FIG. 7, a first type deterioration state estimator 12A comprises a threshold voltage section determiner 12-1A, a first counting unit 12-2A, a first quality estimation information calculator 120-3A, and a first deterioration state determiner 12-4A.

First, memory system 100 obtains hard-decision data HD and reliability data RD according to a reading process. For example, the hard-decision data HD and reliability data RD may be obtained via a soft-decision reading process. According to the soft-decision reading process, data is read from a selected wordline of a memory cell array by applying a plurality of read voltages on one valley of threshold voltage distributions with respect to memory cells. The plurality of read voltages for the soft-decision reading process may include a first read voltage Vr1 for a hard-decision, a second read voltage Vr1−ΔV1 decreased by an initially set first offset voltage ΔV1 based on first read voltage Vr1, and a third read voltage Vr1+ΔV2 increased by an initially set second offset voltage ΔV2 based on first read voltage Vr1.

Figure 23:
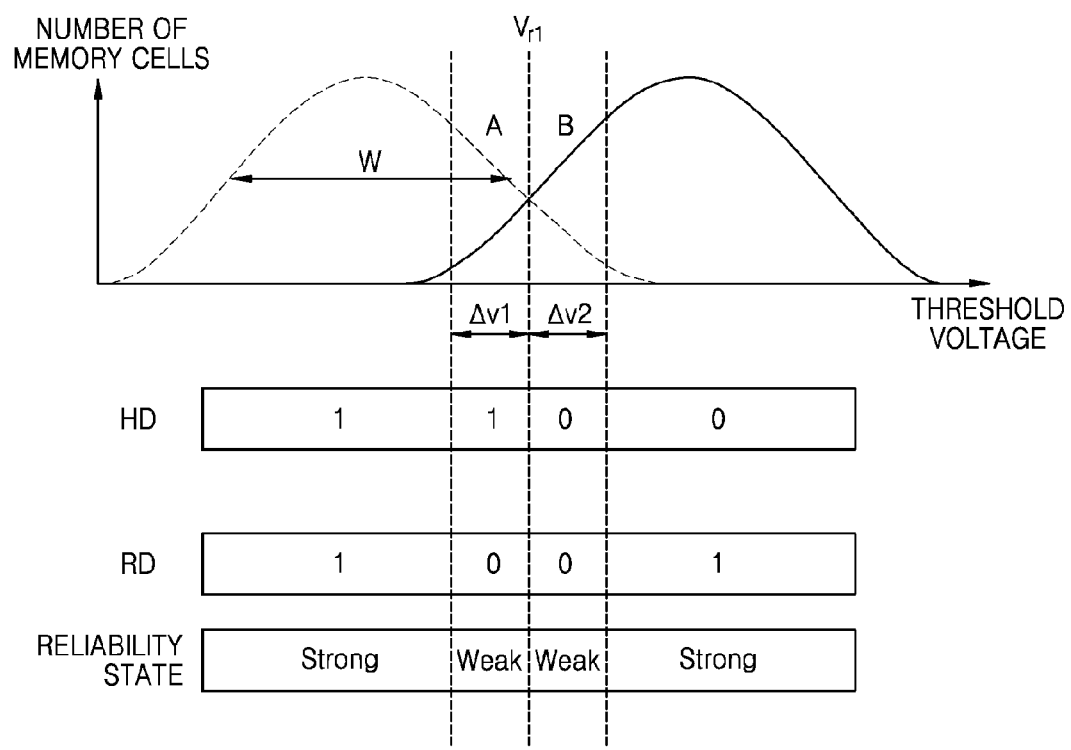
FIG. 23 is a diagram for describing a soft-decision reading process according to an embodiment of the inventive concept.

FIG. 23 is a diagram for describing a soft-decision reading process with respect to one trough between threshold voltage distributions of memory cells, according to an embodiment of the inventive concept. Alternatively, the soft-decision reading process may be performed according to troughs between threshold voltage distributions in a multi-level memory cell in the same manner.

Referring to FIG. 23, during the soft-decision reading process, memory device 20 generates the hard-decision data HD according to a reading process by first read voltage Vr1, and generates reliability data RD according to reading processes by second read voltage Vr1−ΔV1 and third read voltage Vr1+ΔV2 third read voltage.

For example, memory device 20 may generate hard-decision data HD by detecting memory cells whose threshold voltages are lower than or equal to first read voltage Vr1 as "1", and detecting memory cells whose threshold voltages are higher than first read voltage Vr1 as "0".

For example, memory device 20 may generate reliability data RD by detecting memory cells whose threshold voltages are lower than or equal to second read voltage Vr1−ΔV1 or memory cells whose threshold voltages are higher than third read voltage Vr1+ΔV2 as "1", and detecting memory cells whose threshold voltages are higher than second read voltage Vr1−ΔV1 and lower than or equal to third read voltage Vr1+ΔV2 as "0". At this time, the memory cells whose reliability data RD is "0" have "weak" reliability and the memory cells whose reliability RD is "1" have "strong" reliability.

Threshold voltage section determiner 12-1A is capable of identifying memory cells in a threshold voltage section A and memory cells in a threshold voltage section B, based on the hard-decision data HD and reliability data RD received from memory device 20 during the soft-decision reading process.

For example, referring to FIG. 23, a memory cell whose hard-decision data HD is read to be "1" and reliability data RD is read to be "0" may be determined to be in the threshold voltage section A, and a memory cell whose hard-decision data HD is read to be "0" and reliability data RD is read to be "0" may be determined to be in the threshold voltage section B.

First counting unit 12-2A counts memory cells between threshold voltage sections defined by a plurality of read voltages for generating soft-decision data. For example, first counting unit 12-2A counts memory cells identified to be in the threshold voltage section A by threshold voltage section determiner 12-1A to generate first information INF1, and counts memory cells identified to be in the threshold voltage section B to generate second information INF2.

First quality estimation information calculator 12-3A calculates first type quality estimation information QEINF1 indicating states of threshold voltage distributions using the generated first information INF1 and second information INF2. The first type quality estimation information QEINF1 may include information indicating read voltage displacement and a threshold voltage distribution width level. For example, first quality estimation information calculator 12-3A may generate third information INF3 by obtaining a difference between first information INF1 and second information INF2, and generate fourth information INF4 by obtaining a sum of first information INF1 and second information INF2. Third information INF3 denotes the read voltage displacement, and fourth information INF4 denotes the threshold voltage distribution width level. Accordingly, the first type quality estimation information QEINF1 may be third and fourth information INF3 and INF4.

First deterioration state determiner 12-4A determines a deterioration state based on third and fourth information INF3 and INF4, i.e., the first type quality estimation information QEINF1 generated by first quality estimation information calculator 12-3A.

Figure 24:
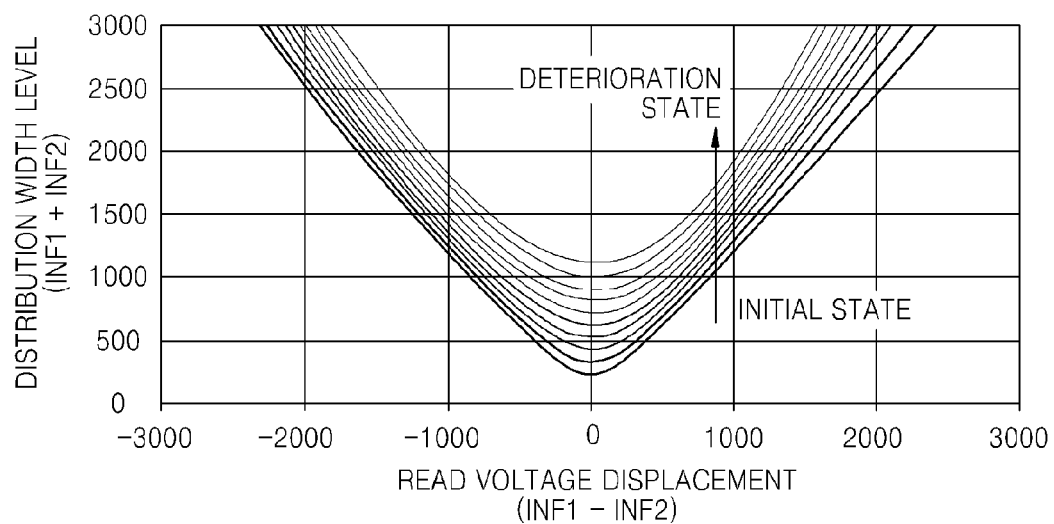
FIG. 24 is a graph showing a threshold voltage distribution width level with respect to read voltage displacement in a memory device, according to a number of program/erase (PE) cycles.

FIG. 24 is a graph showing a threshold voltage distribution width level with respect to read voltage displacement in a memory device, according to a number of program/erase (PE) cycles.

Referring to FIG. 24, the threshold voltage distribution width level with respect to the read voltage displacement changes from an initial state to a deterioration state according to an increase of the number of PE cycles. In other words, where the number of PE cycles increases, the threshold voltage distribution width level with respect to the read voltage displacement changes in a direction indicated by an arrow.

In FIG. 24, a value (INF1+INF2) indicating the threshold voltage distribution width level increases as the number of PE cycles increase at the same point of the read voltage displacement. In other words, a threshold voltage distribution width increases according to the increase of the number of PE cycles at the same point of the read voltage displacement. Also, the threshold voltage distribution width increases as a value (INF1−INF2) indicating the read voltage displacement increases at the same number of PE cycles. As illustrated in FIG. 24, where deterioration of the memory device increases, the (INF1+INF2) value increases with respect to the (INF1−INF2) value.

A threshold voltage distribution width level according to read voltage displacement for determining whether error correction is reliable may be determined via pre-experiments. Via the pre-experiments, a reference trajectory of the threshold voltage distribution width level according to the read voltage displacement, which requires a wear leveling process, may be found. The reference trajectory may be expressed in an approximated function. A plurality of reference trajectories corresponding to a plurality of quality levels may be set.

First deterioration state determiner 12-4A obtains a first decision reference value REF1 that is a threshold voltage distribution width corresponding to third information INF3 based on the reference trajectory found via the pre-experiments. The first decision reference value REF1 may be obtained by substituting the approximated function by third information INF3. Alternatively, the first decision reference value REF1 corresponding to third information INF3 may be found from a mapping table indicating the reference trajectory.

First deterioration state determiner 12-4A compares fourth information INF4 and first decision reference value REF1 found from the reference trajectory, and determines a deterioration state to be a first deterioration state where fourth information INF4 is higher than first decision reference value REF1. Information about the first deterioration state determined by first deterioration state determiner 12-4A is transmitted to CPU 11 of memory controller 10.

Figure 8:
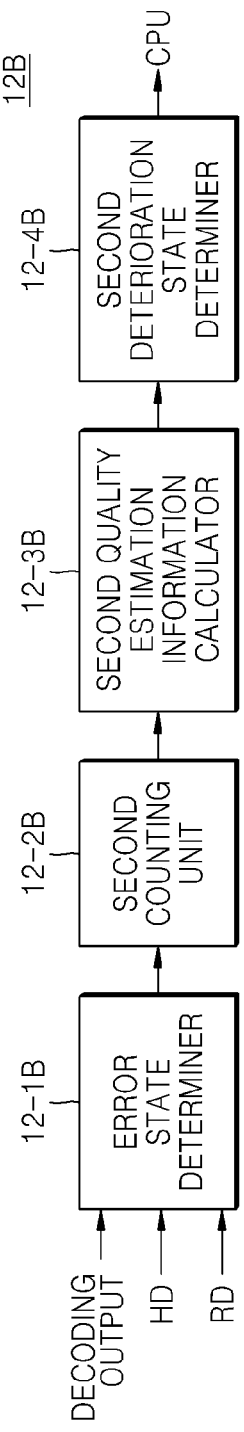
FIG. 8 is a block diagram of a deterioration state estimator in the memory controller of FIG. 1, according to another embodiment of the inventive concept.

FIG. 8 is a block diagram of deterioration state estimator 12 in memory controller 10 of FIG. 1, according to another embodiment of the inventive concept.

Referring to FIG. 8, a second type deterioration state estimator 12B includes an error state determiner 12-1B, a second counting unit 12-2B, a second quality estimation information calculator 12-3B, and a second deterioration state determiner 12-4B.

Error state determiner 12-1B detects a bit whose error is corrected by comparing soft-decision decoding processed data and the hard-decision data HD, and determines whether the detected bit corresponds to a strong error bit based on reliability data RD corresponding to the detected bit. In other words, data whose error is corrected by a soft-decision decoding process and corresponding hard-decision data HD are compared in a bit unit to search for bits that are not the same. The bits found as such are bits whose errors are corrected. Then, a bit value of reliability data RD corresponding to a bit whose error is corrected is checked, and when the bit value shows a "strong" state, the bit is determined to be a strong error bit. For example, referring to FIG. 23, when a bit value of reliability data RD corresponding to a bit whose error is corrected is "1", the bit is determined to be a strong error bit.

Second counting unit 12-2B counts bits whose errors are corrected detected by error state determiner 12-1B to calculate a number C1, and counts bits determined to be strong error bits to calculate a number C2. The numbers C1 and C2 may be calculated in a page size unit. Alternatively, the numbers C1 and C2 may be calculated in a block or sector size unit.

The second quality estimation information calculator 12-3B calculates a ratio of the number C2 to the number C1, and outputs the calculated ratio as second type quality estimation information QEINF2. For example, the second type quality estimation information QEINF2 may be calculated according to C2/C1.

The second deterioration state determiner 12-4B compares the second type quality estimation information QEINF2 calculated by the second quality estimation information calculator 12-3B with a second decision reference value REF2, and where the second type quality estimation information QEINF2 is higher than the second decision reference value REF2, determines a deterioration state to be a second deterioration state. Second decision reference value REF2 may be determined to be a threshold ratio of strong error bits that requires a wear leveling process via pre-experiments. Information about the second deterioration state determined by the second deterioration state determiner 12-4B is transmitted to CPU 11 of memory controller 10.

Deterioration state estimator 12 of memory system 100 of FIG. 1 may include any one of the first type deterioration state estimator 12A of FIG. 7 or the second type deterioration state estimator 12B of FIG. 8. Alternatively, deterioration state estimator 12 may include both of the first and second type deterioration state estimators 12A and 12B. In this case, CPU 11 may control memory system 100 such that a deterioration state is first determined by the first type deterioration state estimator 12A, and if the first deterioration state is not determined, the deterioration state is then determined by the second type deterioration state estimator 12B.

Figure 9:
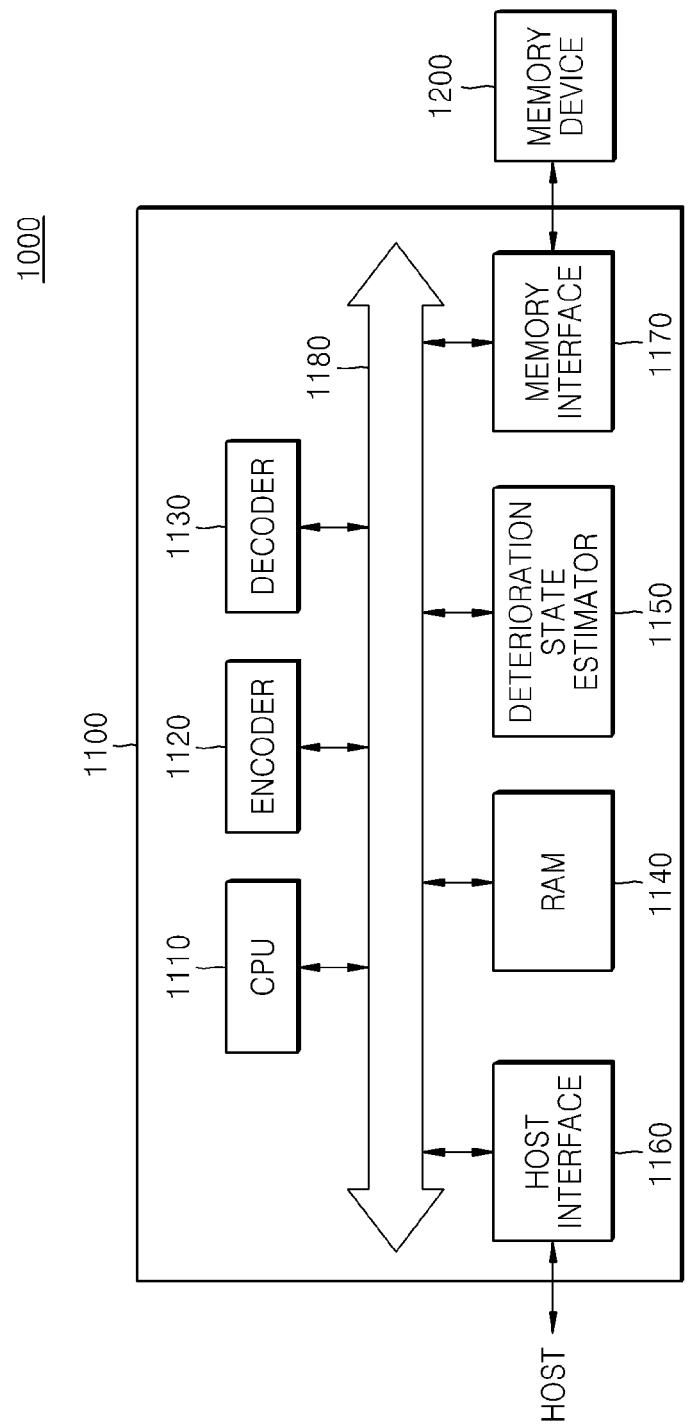
FIG. 9 is a block diagram of a memory system according to another embodiment of the inventive concept.

FIG. 9 is a block diagram of a memory system 1000 according to another embodiment of the inventive concept.

Referring to FIG. 9, memory system 1000 comprises a memory controller 1100 and a memory device 1200.

Memory device 1200 may be a nonvolatile semiconductor memory device, and in detail, may be a flash memory, a PRAM, an FRAM, or an MRAM. Because components of memory device 20 of FIG. 1 and memory device 1200 of FIG. 9 are the same, details thereof are not repeated.

If memory device 1200 is a nonvolatile semiconductor memory, such as a flash memory, memory system 1000 may be a solid state drive (SSD). Memory controller 1100 controls an erase, write, or read operation of memory device 1200 in response to a command received from a host.

Memory controller 1100 comprises a CPU 1110, an encoder 1120, a decoder 1130, an RAM 1140, a deterioration state estimator 1150, a host interface 1160, a memory interface 1170, and a bus 1180. CPU 1110 is electrically connected to encoder 1120, decoder 1130, RAM 1140, deterioration state estimator 1150, host interface 1160, and memory interface 1170 through bus 1180. Bus 1180 is a transfer path for transferring information between components of memory controller 1100. CPU 1110 controls overall operations of memory system 1000. In detail, CPU 1110 interprets a command received from the host, and controls memory system 1000 to perform operations based on the interpreted command.

During a read operation, CPU 1110 provides a read command and an address to memory device 1200, and during a write operation, CPU 1110 provides a write command, an address, and an encoded codeword to memory device 1200. Also, CPU 1110 converts a logical address received from the host to a physical page address using metadata stored in RAM 1140.

CPU 1110 controls memory system 1000 to perform a deterioration state estimating method of a memory device and a wear leveling method in a memory system, according to embodiments of the inventive concept shown in FIGS. 10 through 21. CPU 1110 controls memory controller 1100 such that encoder 1120 encodes information word received from the host during a write operation, and decoder 1130 decodes data read from memory device 1200 during a read operation. Encoder 1120 generates a codeword by attaching a plurality of parity bits defined by a low density parity check (LDPC) code to the information word received from the host.

Decoder 1130 restores the information word by performing a LDPC decoding process on the data read from memory device 1200 in a codeword unit. Decoder 1130 may selectively perform a hard-decision decoding process and a soft-decision decoding process. For example, decoder 1130 may perform error correction by first performing the hard-decision decoding process, and if the error correction fails, may perform the soft-decision decoding process.

RAM 1140 temporarily stores data received from the host or data read from memory device 1200. Also, CPU 1110 stores data required to control memory system 1000, which is read from memory device 1200. The data required to control memory system 1000 may include metadata. RAM 1140 may be a dynamic random access memory (DRAM) or static RAM (SRAM). For reference, the metadata may include information for managing memory system 1000. The metadata that is management information may include information about a mapping table used to convert a logical address to a physical address of memory device 1200.

Host interface 1160 implements a data exchange protocol for exchanging data with the host connected to memory system 1000, and mutually connects memory system 1000 and the host. Host interface 1160 may be an advanced technology attachment (ATA) interface, a serial advanced technology attachment (SATA) interface, a parallel advanced technology attachment (PATA) interface, a universal serial bus (USB) or serial attached small computer system (SAS) interface, a small computer system interface (SCSI), an embedded multimedia card (eMMC) interface, or a Unix file system (UFS) interface, but is not limited thereto. Host interface 1160 may exchange a command, an address, and data with the host under control of CPU 1110.

Memory interface 1170 is electrically connected to memory device 1200. Memory interface 1170 exchanges a command, an address, and data with memory device 1200 under control of CPU 1110. Memory interface 1170 may be configured to support an NAND flash memory or a NOR flash memory. Memory interface 1170 may be configured such that software and hardware interleave operations are selectively performed via a plurality of channels. Deterioration state estimator 1150 is the same as deterioration state estimator 12 of FIG. 1, and thus, performs the same operations as deterioration state estimator 12 described above. Accordingly, details thereof are not repeated.

Next, a method of estimating the deterioration state of a memory device, and a wear leveling method used in a memory system using the method of estimating the deterioration state, which are performed under control of CPU 1110, will be described in detail with reference to FIGS. 10 through 21.

Figure 10:
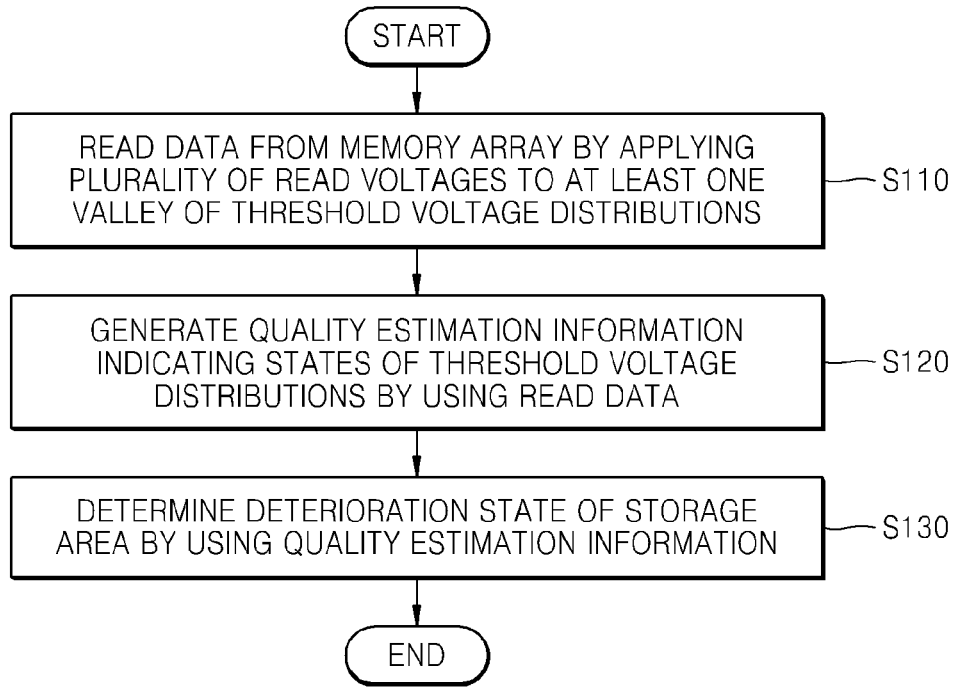
FIG. 10 is a flowchart illustrating a method of estimating the deterioration state of a memory device, according to an embodiment of the inventive concept.

FIG. 10 is a flowchart illustrating a method of estimating the deterioration state of a memory device, according to an embodiment of the inventive concept. For explanation purposes, it will be assumed that the method of FIG. 10 is performed by memory system 1000, although it is not limited thereto.

In operation S110, CPU 1110 controls memory system 1000 to read data from the selected wordline of the memory cell array by applying each of the plurality of read voltages to at least one valley of the threshold voltage distributions with respect to the memory cells during a soft-decision read operation mode. For example, the plurality of read voltages applied during the soft-decision read operation mode may include first read voltage Vr1 for hard-decision, second read voltage Vr1−ΔV1 decreased by the initially set first offset voltage ΔV1 based on first read voltage Vr1, and third read voltage Vr1+ΔV2 increased by the initially set second offset voltage ΔV2 based on first read voltage Vr1.

In operation S120, CPU 1110 controls memory system 1000 to generate the quality estimation information indicating the states of the threshold voltage distributions using the data read from the selected wordline. For example, the number of memory cells in each of the threshold voltage sections defined by the plurality of read voltages set to generate soft-decision data may be calculated, and the quality estimation information may be generated using the calculated number of memory cells. Alternatively, the bits whose errors are corrected may be detected from the threshold voltage sections defined by the plurality of read voltages for generating soft-decision data based on a result of a decoding process using the soft-decision data, and the quality estimation information may be generated based on the number of bits, from among the bits whose errors are corrected, corresponding to a memory cell having a threshold voltage not included in a section between a minimum level and a maximum level of the plurality of read voltages.

In operation S130, CPU 1110 controls memory system 1000 to determine the deterioration state of the storage area using the quality estimation information.

Figure 11:
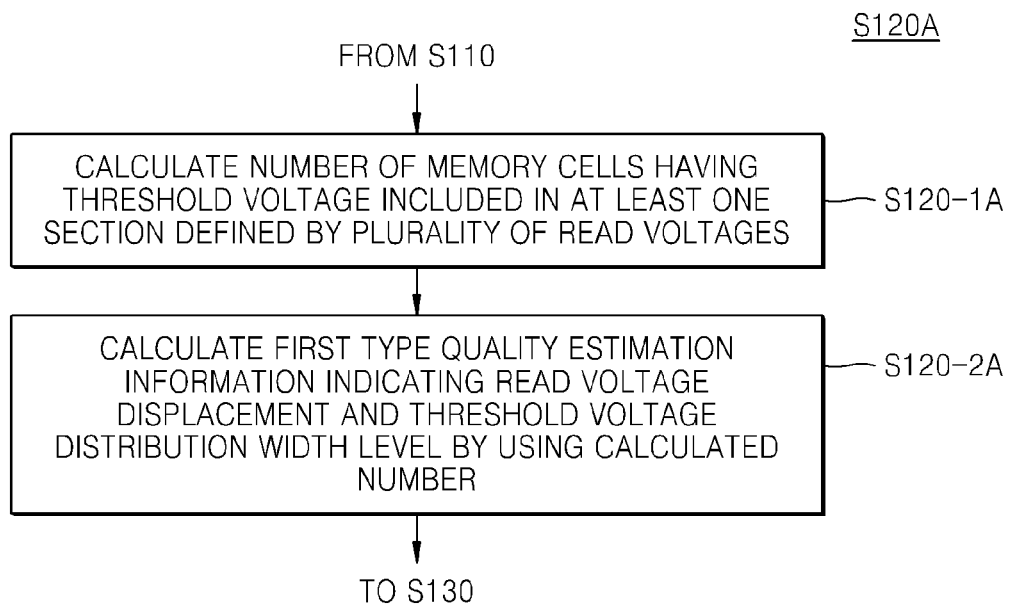
FIG. 11 is a flowchart illustrating in further detail generating quality estimation information of FIG. 10, according to an embodiment of the inventive concept.

FIG. 11 is a flowchart illustrating in further detail the generating of the quality estimation information of FIG. 10, according to an embodiment of the inventive concept.

Selected operations of generating quality estimation information (operation S120A) according to an embodiment of the inventive concept of FIG. 11 are as follows.

In operation S120-1A, CPU 1110 controls memory system 1000 to calculate the number of memory cells in each of the threshold voltage sections defined by the plurality of read voltages from the data read from the selected wordline of the memory cell array by applying each of the plurality of read voltages.

In operation S120-2A, CPU 1110 controls memory system 1000 to calculate the first type quality estimation information QEINF1 indicating the read voltage displacement and the threshold voltage distribution width level based on the calculated number of memory cells.

Figure 12:
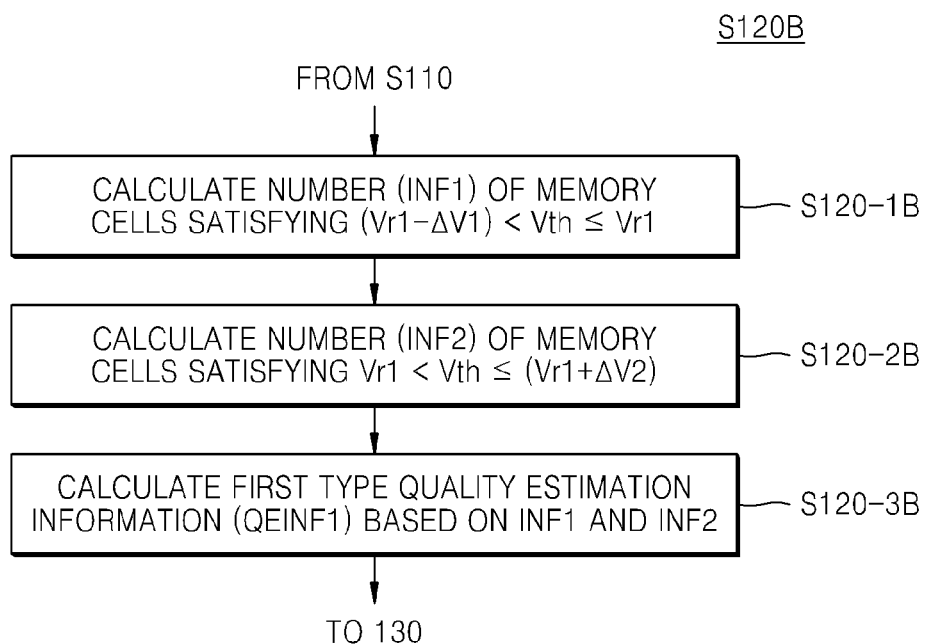
FIG. 12 is a flowchart illustrating in further detail generating quality estimation information of FIG. 10, according to another embodiment of the inventive concept.

FIG. 12 is a flowchart illustrating in further detail the generating of the quality estimation information of FIG. 10, according to another embodiment of the inventive concept.

Selected operations of generating quality estimation information (operation S120B) according to an embodiment of the inventive concept of FIG. 12 are as follows.

In operation S120-1B, CPU 1110 controls memory system 1000 to count the memory cells having threshold voltage Vth in a section between first read voltage Vr1 for hard-decision and second read voltage Vr1−ΔV1 decreased by the initially set first offset voltage ΔV1 based on first read voltage Vr1, and generate first information INF1 as the result of the counting. In other words, the memory cells whose threshold voltage Vth satisfies a condition (Vr1−ΔV1)<Vth≤Vr1 may be counted using the hard-decision data HD and reliability data RD read during the soft-decision read operation. For example, referring to FIG. 23, first information INF1 may be generated by counting the memory cells whose threshold voltage Vth satisfies the condition (Vr1−ΔV1)<Vth≤Vr1 and is in the threshold voltage section A, whose hard-decision data HD is "1", and whose reliability data RD is "0". First information INF1 may be generated in a sector, page, or block size unit.

In operation S120-2B, CPU 1110 controls memory system 1000 to count the memory cells whose threshold voltage Vth is in a section between first read voltage Vr1 for hard-decision and third read voltage Vr1+ΔV2 increased by the initially set second offset voltage ΔV2 based on first read voltage Vr1, and generate second information INF2 as the result of the counting. In other words, the memory cells whose threshold voltage Vth satisfies a condition Vr1<Vth≤(Vr1+ΔV2) may be counted using the hard-decision data HD and reliability data RD read during the soft-decision read operation. For example, referring to FIG. 23, second information INF2 may be generated by counting the memory cells whose threshold voltage Vth satisfies the condition Vr1<Vth≤(Vr1+ΔV2) and is in the threshold voltage section B, whose hard-decision data HD is "0", and whose reliability data RD is "0". Second information INF2 may be generated in a sector, page, or block size unit.

In operation S120-3B, CPU 1110 controls memory system 1000 to calculate the first type quality estimation information QEINF1 based on first information INF1 and second information INF2.

Figure 13:
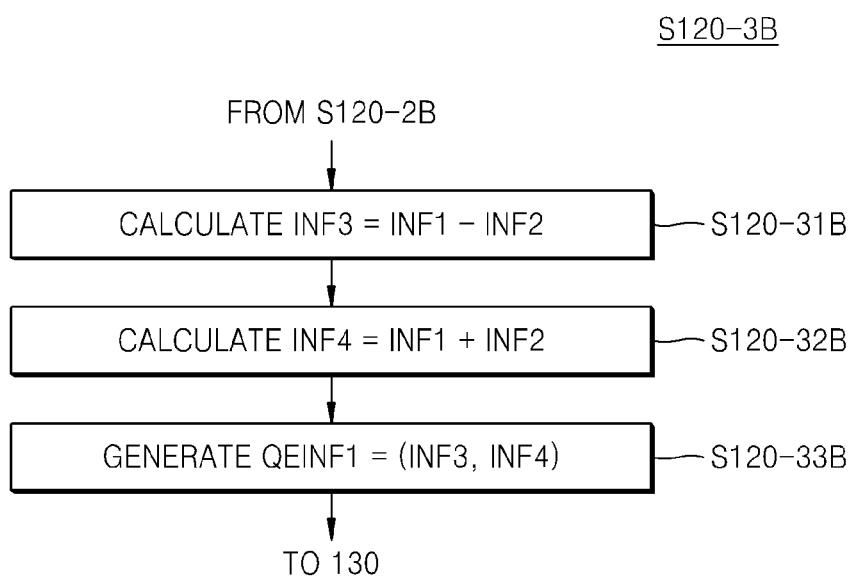
FIG. 13 is a flowchart illustrating in further detail determining first type quality estimation information of FIG. 12, according to an embodiment of the inventive concept.

FIG. 13 is a flowchart illustrating in further detail the calculating of the first type quality estimation information QEINF1 of FIG. 12, according to an embodiment of the inventive concept.

Selected operations of the calculating of the first quality estimation information QEINF1 (operation S120-3B) according to an embodiment of the inventive concept are as follows.

In operation S120-31B, CPU 1110 controls memory system 1000 to generate third information INF3 by calculating a difference between first information INF1 and second information INF2.

In operation S120-32B, CPU 1110 controls memory system 1000 to generate fourth information INF4 by calculating a sum of first information INF1 and second information INF2.

In operation S120-33B, CPU 1110 controls memory system 1000 to generate the first type quality estimation information QEINF1 including the third and fourth information INF3 and INF4.

Figure 14:
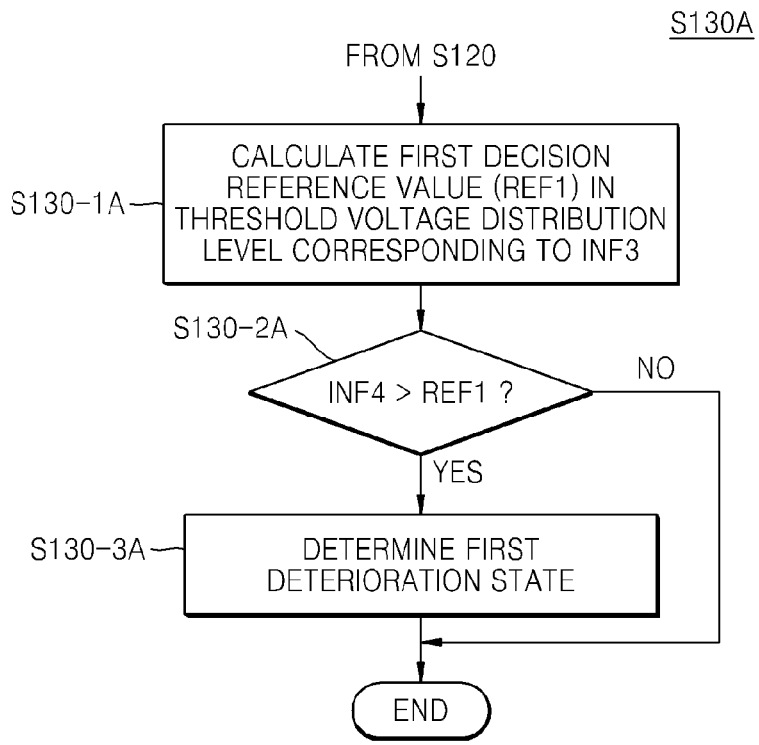
FIG. 14 is a flowchart illustrating in further detail determining a deterioration state of FIG. 10, according to an embodiment of the inventive concept.

FIG. 14 is a flowchart illustrating in further detail the determining of the deterioration state of FIG. 10, according to an embodiment of the inventive concept.

Selected operations of determining of a deterioration state (operation S130A) according to an embodiment of the inventive concept of FIG. 14 are as follows.

In operation S130-1A, CPU 1110 controls memory system 1000 to calculate the first decision reference value REF1 in the threshold voltage distribution level corresponding to third information INF3 in the first type quality estimation information QEINF1. Because the calculating of the first decision reference value REF1 is described in detail above with reference to FIG. 24, details thereof are not repeated here.

In operation S130-2A, CPU 1110 controls memory system 1000 to compare fourth information INF4 in the first type quality estimation information QEINF1 and the first decision reference value REF1.

In operation S130-3A, where it is determined that fourth information INF4 is higher than first decision reference value REF1 in operation S130-2A, CPU 1110 controls memory system 1000 to determine the deterioration state to be the first deterioration state. In other words, the storage area of memory device 1200 from which the data for generating the first type quality estimation information QEINF1 is read is determined to be the first deterioration state. The storage area may be in a block or page unit.

Figure 15:
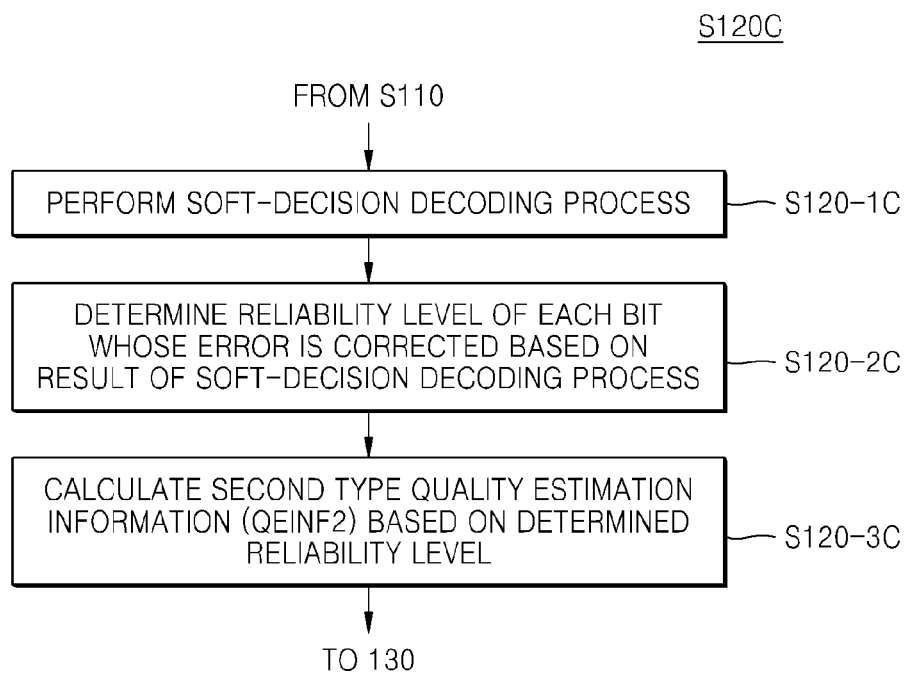
FIG. 15 is a flowchart illustrating in further detail generating quality estimation information of FIG. 10, according to another embodiment of the inventive concept.

FIG. 15 is a flowchart illustrating in further detail the generating of the quality estimation information of FIG. 10, according to another embodiment of the inventive concept.

Selected operations of generating of quality estimation information (operation S120C) according to another embodiment of the inventive concept of FIG. 15 are as follows.

In operation S120-1C, CPU 1110 controls memory system 1000 to perform the soft-decision decoding process using the data read from memory device 1200 according to the soft-decision reading process. During the soft-decision decoding process, decoder 1130 performs error detection and correction using the hard-decision data HD and reliability data RD read from memory device 1200 according to the soft-decision reading process.

In operation S120-2C, CPU 1110 controls memory system 1000 to determine a reliability level of each of the bits whose errors are corrected based on a result of the soft-decision decoding process. For example, CPU 1110 may control deterioration state estimator 1150 to search for the bits whose errors are corrected by comparing the result of the soft-decision decoding process and the hard-decision data HD, and determine the reliability level of the found bits using reliability data RD.

In operation S120-3C, CPU 1110 controls memory system 1000 to calculate the second type quality estimation information QEINF2 based on the determined reliability level.

Figure 16:
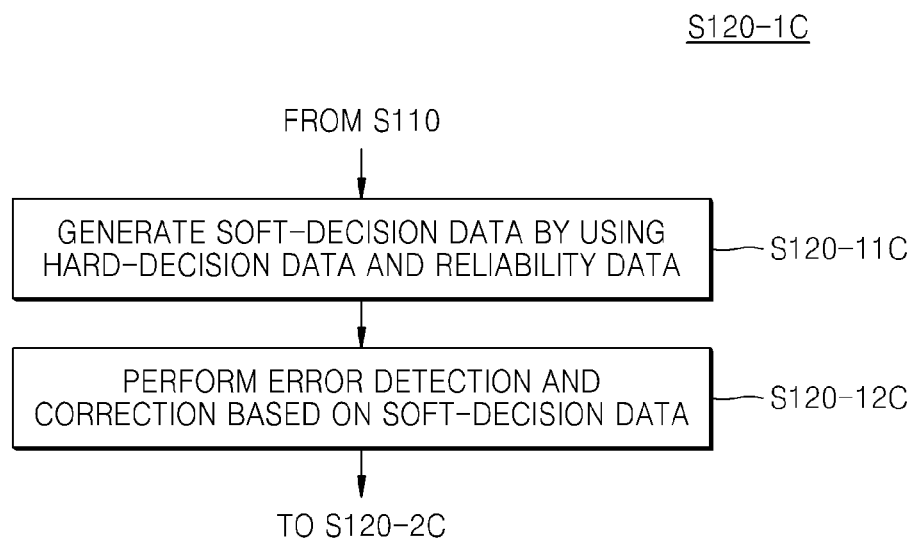
FIG. 16 is a flowchart illustrating in further detail performing a soft-decision decoding process of FIG. 15, according to an embodiment of the inventive concept.

FIG. 16 is a flowchart illustrating in further detail the performing of the soft-decision decoding process of FIG. 15, according to an embodiment of the inventive concept.

Selected operations for performing the soft-decision decoding process (operation S120-1C) according to an embodiment of the inventive concept of FIG. 16 are as follows.

In operation S120-11C, CPU 1110 controls memory system 1000 to generate the soft-decision data using the hard-decision data HD and reliability data RD read from memory device 1200 according to the soft-decision reading process. For example, the soft-decision data may be probability information calculated based on the hard-decision data HD and reliability data RD.

In operation S120-12C, CPU 1110 controls decoder 1130 to perform error detection and correction based on the soft-decision data. For example, decoder 1130 may perform the error detection and correction according to an LDPC decoding process.

Figure 17:
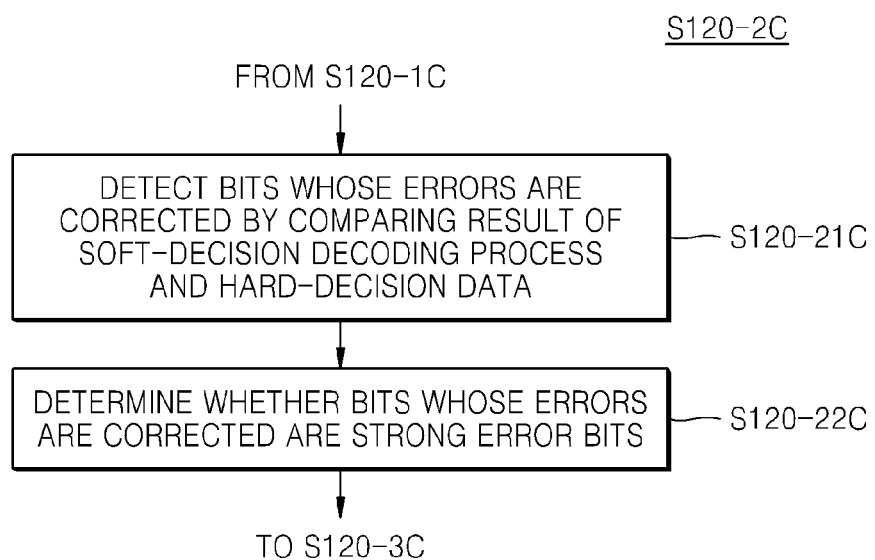
FIG. 17 is a flowchart illustrating in further detail determining a reliability level of FIG. 15, according to an embodiment of the inventive concept.

FIG. 17 is a flowchart illustrating in further detail the determining of the reliability level of FIG. 15, according to an embodiment of the inventive concept. Selected operations of the determining of the reliability level (operation S120-2C) according to an embodiment of the inventive concept of FIG. 17 are as follows.

In operation S120-21C, CPU 1110 controls memory system 1000 to detect the bits whose errors are corrected by comparing the result of the soft-decision decoding process and the hard-decision data HD. For example, bits of data whose errors are corrected by the soft-decision decoding process and bits of corresponding hard-decision data HD may be compared in a bit unit, and bits that are not the same may be detected as the bits whose errors are corrected.

In operation S120-22C, CPU 1110 controls memory system 1000 to determine whether the bits whose errors are corrected are strong error bits using reliability data RD. In other words, a bit value of reliability data RD corresponding to a bit whose error is corrected is checked, and when the bit value shows a "strong" state, the bit is determined to be a strong error bit. For example, referring to FIG. 23, when the bit value of reliability data RD corresponding to the bit whose error is corrected is "1", the bit is determined to be a strong error bit.

Figure 18:
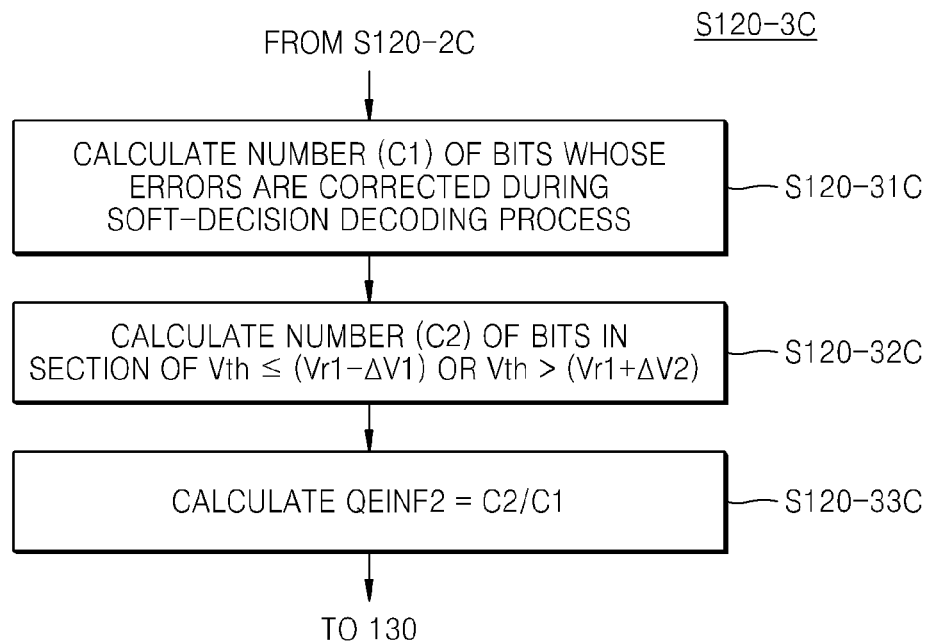
FIG. 18 is a flowchart illustrating in further detail determining second type quality estimation information of FIG. 15, according to an embodiment of the inventive concept.

FIG. 18 is a flowchart illustrating in further detail the calculating of the second type quality estimation information QEINF2 of FIG. 15, according to an embodiment of the inventive concept. Selected operations of the calculating of the second type quality estimation information QEINF2 (operation S120-3C) according to an embodiment of the inventive concept of FIG. 18 are as follows.

In operation S120-31C, CPU 1110 controls memory system 1000 to calculate the number C1 of bits whose errors are corrected during the soft-decision decoding process. For example, the number C1 may be calculated in a sector, page, or a block unit.

In operation S120-32C, CPU 1110 controls memory system 1000 to calculate the number C2 of strong error bits from among the bits whose errors are corrected. For example, referring to FIG. 23, when bit values of reliability data RD corresponding to bits whose errors are corrected are "1", the bits may be determined as strong error bits, and the number of strong error bits may be counted to calculate the number C2.

In operation S120-33C, CPU 1110 controls memory system 1000 to calculate a ratio of the number C2 to the number C1, and obtains the ratio as the second type quality estimation information QEINF2.

Figure 19:
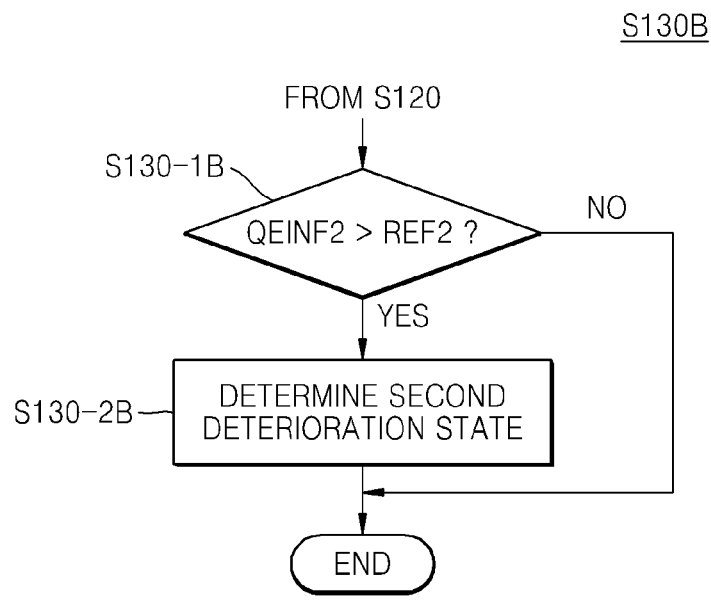
FIG. 19 is a flowchart illustrating determining a deterioration state of the memory device of FIG. 10, according to another embodiment of the inventive concept.

FIG. 19 is a flowchart illustrating the determining of the deterioration state of FIG. 10, according to another embodiment of the inventive concept. Selected operations of determining of a deterioration state (operation S130B) according to another embodiment of the inventive concept of FIG. 19 are as follows.

In operation S130-1B, CPU 1110 controls memory system 1000 to compare the second type quality estimation information QEINF2 and the second decision reference value REF2. In operation S130-2B, when the second type quality estimation information QEINF2 is higher than the second decision reference value REF2, CPU 1110 controls memory system 1000 to determine the deterioration state to be the second deterioration state.

Figure 20:
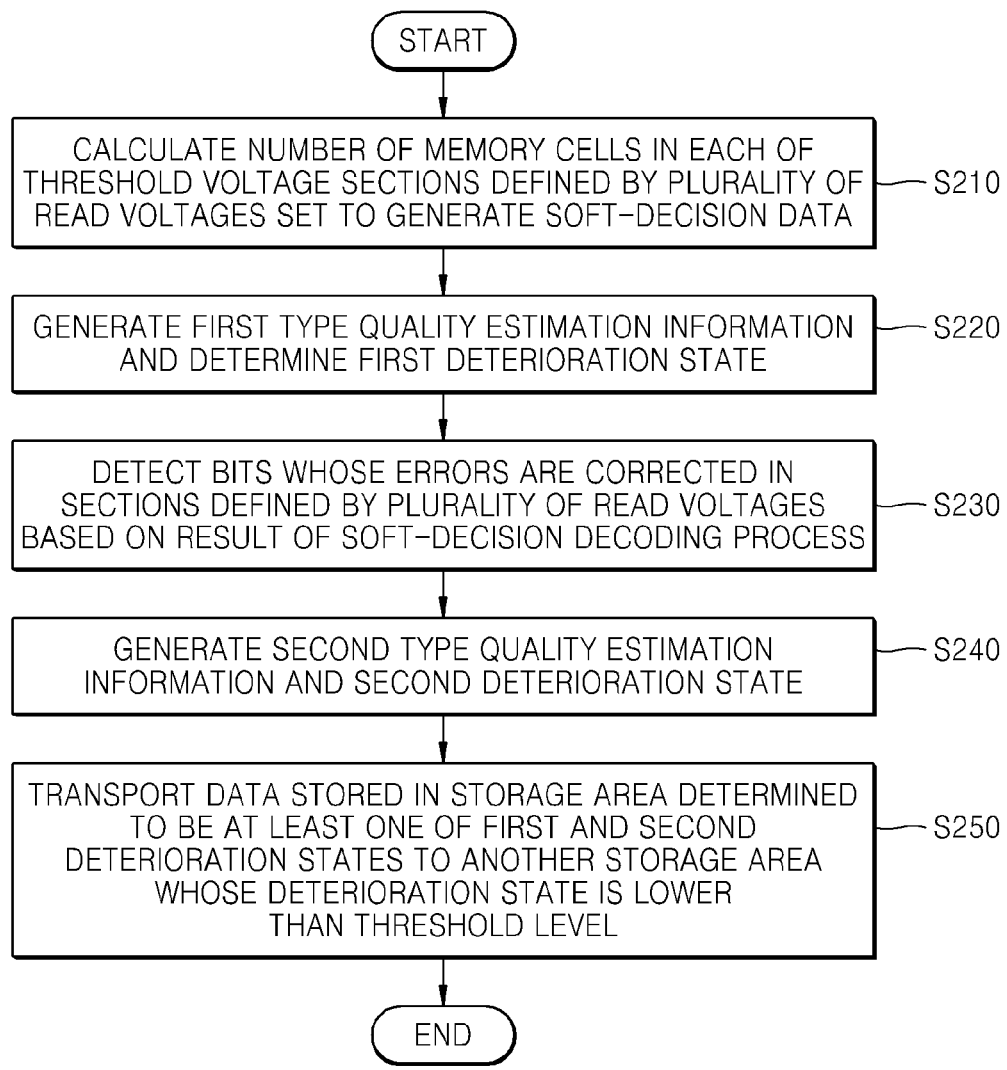
FIG. 20 is a flowchart illustrating a wear leveling method used in a memory system, according to an embodiment of the inventive concept.

FIG. 20 is a flowchart illustrating a wear leveling method used in memory system 1000, according to an embodiment of the inventive concept.

In operation S210, CPU 1110 controls memory system 1000 to calculate the number of memory cells in each of the threshold voltage sections defined by the plurality of read voltages set to generate the soft-decision data. For example, as shown in FIG. 23, the numbers of memory cells whose threshold voltages are in the threshold voltage sections A and B with respect to at least one trough between the threshold voltage distributions of the memory cells may be calculated using the hard-decision data HD and reliability data RD.

In operation S220, CPU 1110 controls memory system 1000 to generate the first type quality estimation information QEINF1 using the number calculated in operation S210, and determine the first deterioration state based on the first type quality estimation information QEINF1. For example, the generating of the first type quality estimation information QEINF1 and determining of the first deterioration state may be performed as described above with reference to FIGS. 11 through 14.

In operation S230, CPU 1110 controls memory system 1000 to detect the bits whose errors are corrected in the threshold voltage sections defined by the plurality of read voltages based on the result of soft-decision decoding process. For example, the bits of the data whose errors are corrected by the soft-decision decoding process and the bits of the corresponding hard-decision data HD may be compared in a bit unit, and bits that are not the same may be detected as the bits whose errors are corrected. It may be determined whether the bits whose errors are corrected are included in a threshold voltage section indicating a "strong" state or a "weak" state using reliability data RD.

In operation S240, CPU 1110 controls memory system 1000 to determine the reliability level of each bit whose error is corrected, generate the second type quality estimation information QEINF2 based on the result of the determining, and determine the second deterioration state using the second type quality estimation information QEINF2. The generating of the second type quality estimation information QEINF2 and the determining of the second deterioration state may be performed as described above with reference to FIGS. 18 and 19.

In operation S250, CPU 1110 controls memory system 1000 to transfer the data stored in the storage area determined to be at least one of the first and second deterioration states to the other storage area of memory device 1200 whose deterioration state is lower than the threshold level. The transferring may be performed when memory system 1000 is in an idle state. In other words, the transferring may be performed when memory system 1000 is in a standby state after operations of commands received from the host are performed.

Figure 21:
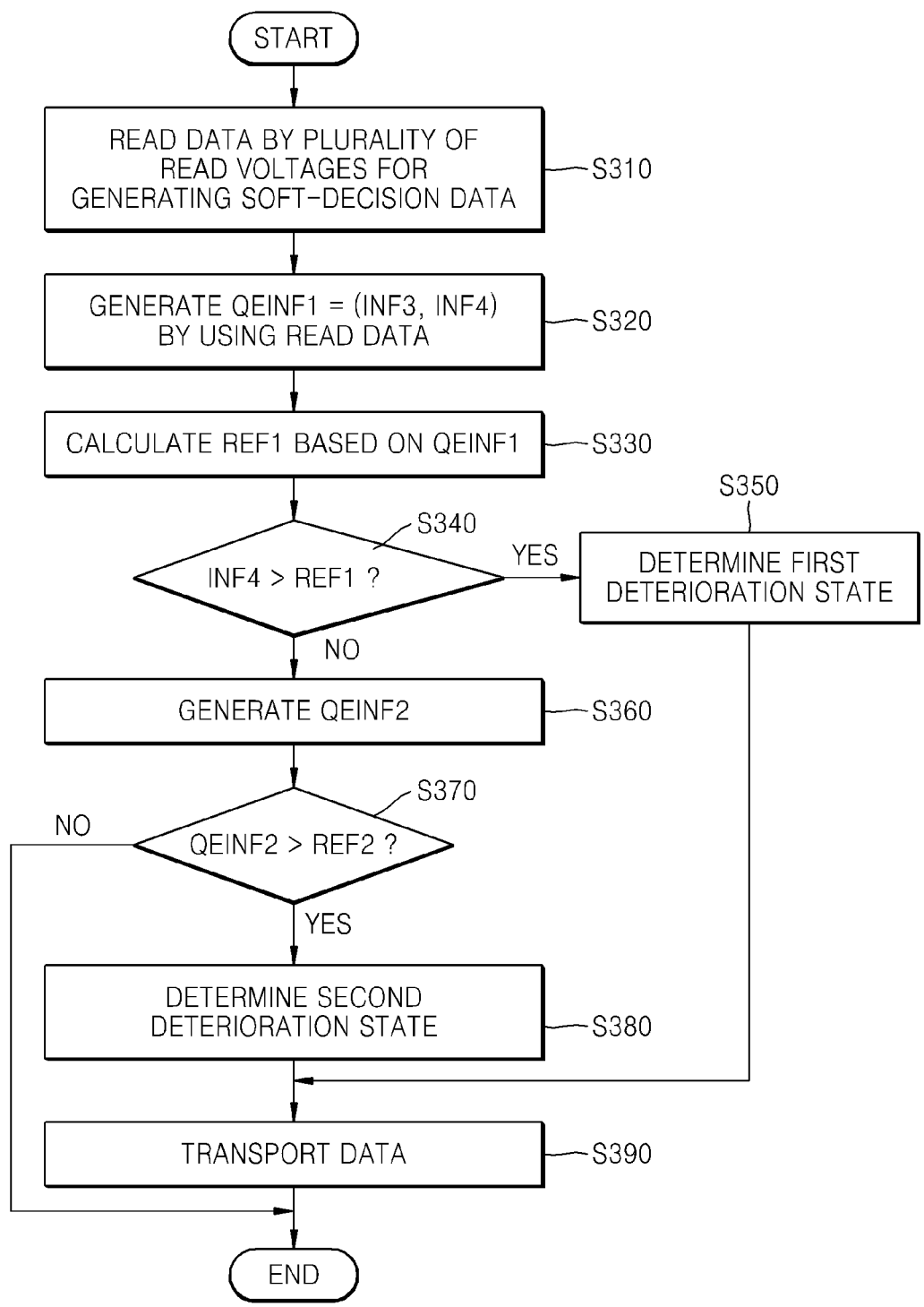
FIG. 21 is a flowchart illustrating a wear leveling method used in a memory system, according to another embodiment of the inventive concept.

FIG. 21 is a flowchart illustrating a wear leveling method that can be performed in memory system 1000, according to another embodiment of the inventive concept.

In operation S310, CPU 1110 controls memory system 1000 to read data from memory device 1200 by applying the plurality of read voltages set to generate the soft-decision data. In operation S320, CPU 1110 controls memory system 1000 to generate the first type quality estimation information QEINF1 (INF, INF4) using the data read from memory device 1200 during the soft-decision reading process. The generating of the first type quality estimation information QEINF1 may be performed as described above with reference to FIGS. 12 and 13.

In operation S330, CPU 1110 controls memory system 1000 to calculate the first decision reference value REF1 based on the first type quality estimation information QEINF1. The first decision reference value REF1 may be calculated as described above with reference to operation S130-1A of FIG. 13.

In operation S340, CPU 1110 controls memory system 1000 to compare fourth information INF4 in the first type quality estimation information QEINF1 and first decision reference value REF1. In operation S350, where it is determined that fourth information INF4 is higher than the first decision reference value REF1 in operation S340, CPU 1110 determines the deterioration state to be the first deterioration state.

In operation S360, where it is determined that fourth information INF4 is not higher than first decision reference value REF1, CPU 1110 controls memory system 1000 to generate the second type quality estimation information QEINF2 using the data read during the soft-decision reading process and the result of the soft-decision decoding process. The generating of the second type quality estimation information QEINF2 may be performed as described above with reference to FIGS. 15 through 18.

In operation S370, CPU 1110 controls memory system 1000 to compare the second type quality estimation information QEINF2 and the second decision reference value REF2. In operation S380, if it is determined that the second type quality estimation information QEINF2 is higher than the second decision reference value REF2 in operation S370, CPU 1110 controls memory system 1000 to determine the deterioration state to be the second deterioration state.

In operation S390, CPU 1110 controls memory system 1000 to transfer the data stored in the storage area determined to be at least one of the first and second deterioration states to the other storage area of memory device 1200 whose deterioration state is lower than the threshold level.

Figure 25:
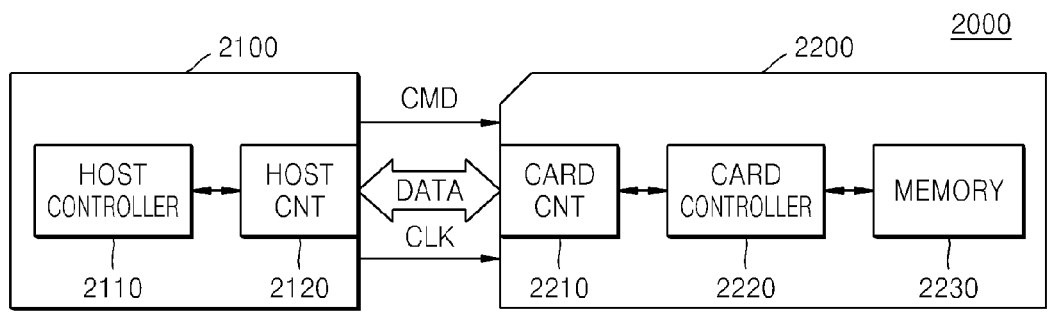
FIG. 25 is a block diagram of a memory system applied to a memory card, according to an embodiment of the inventive concept.

FIG. 25 is a block diagram of a memory system applied to a memory card, according to an embodiment of the inventive concept.

Referring to FIG. 25, a memory card system 2000 comprises a host 2100 and a memory card 2200. Host 2100 comprises a host controller 2110 and a host connector 2120. Memory card 2200 comprises a card connector 2210, a card controller 2220, and a memory device 2230.

Host 2100 writes data on memory card 2200 or reads data stored in memory card 2200. Host controller 2110 transmits command signal CMD, a clock signal CLK generated by a clock generator (not shown) in host 2100, and data DATA to memory card 2200 through host connector 2120.

Card controller 2220 stores data in memory device 2230 by synchronizing to a clock signal generated by a clock generator (not shown) in card controller 2220, in response to a command received through card connector 2210. Memory device 2230 stores data transmitted from host 2100. Here, card controller 2220 may be memory controller 10 or 1100 of FIG. 1 or 9.

Memory card 2200 may be a compact flash card (CFC), a microdrive, a smart media card (SMC), a multimedia card (MMC), a security digital card (SDC), a memory stick, or a USB flash memory driver.

Figure 26:
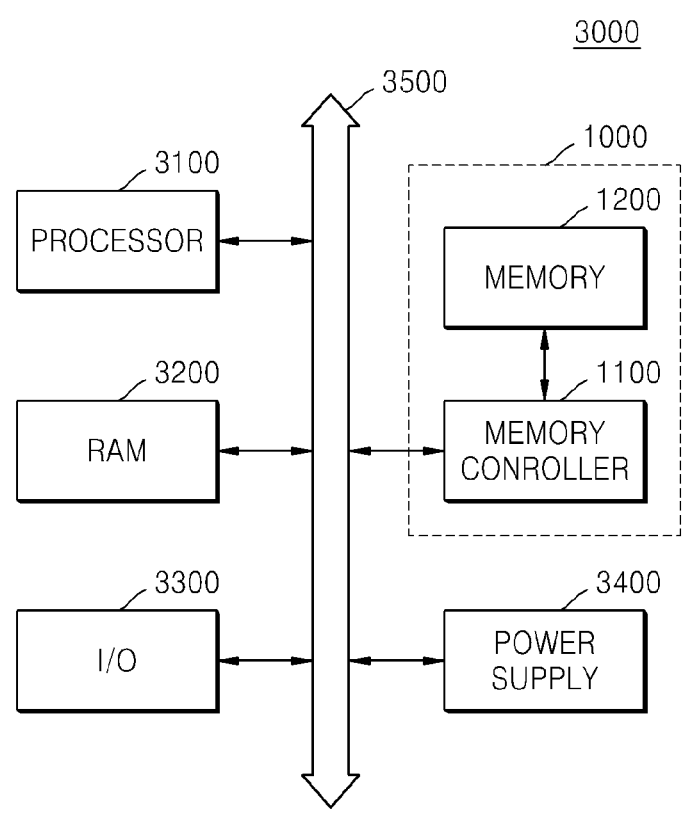
FIG. 26 is a block diagram of a computing system including a memory system, according to an embodiment of the inventive concept.

FIG. 26 is a block diagram of a computing system 3000 comprising memory system 1000, according to an embodiment of the inventive concept.

Referring to FIG. 26, computing system 3000 comprises a processor 3100, a RAM 3200, an input and output device 3300, a power source 3400, and memory system 1000. Although not shown in FIG. 26, computing system 3000 may further comprise ports for communicating with a video card, a sound card, a memory card, and a USB device, or with other electronic devices. Computing system 3000 may be a portable electronic device, such as a personal computer, a laptop, a mobile phone, a personal digital assistant (PDA), or a camera, for example.

Processor 3100 performs certain calculations or tasks, and may be for instance, a microprocessor or a CPU. Processor 3100 may communicate with the RAM 3200, input and output device 3300, and memory system 1000 through a bus 3500, such as an address bus, a control bus, or a data bus. In some embodiments, processor 3100 may be connected to an expansion bus, such as a peripheral component interconnect (PCI) bus.

RAM 3200 stores data required to operate computing system 3000. For example, RAM 3200 may be a DRAM, a mobile DRAM, an SRAM, a PRAM, a ferroelectric RAM (FRAM), an RRAM, and/or an MRAM.

Input and output device 3300 may include an input unit, such as a keyboard, a keypad, or a mouse, and an output unit, such as a printer or a display. Power source 3400 may supply an operation voltage required to operate computing system 3000.

Figure 27:
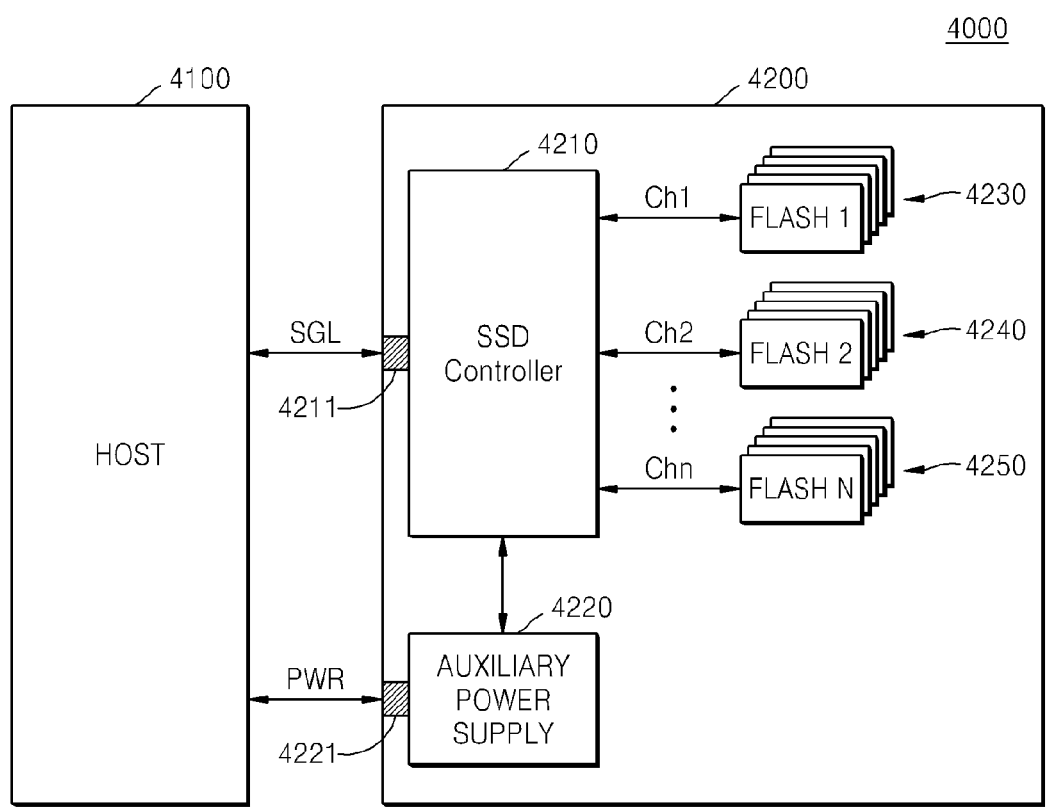
FIG. 27 is a block diagram of a memory system applied to a solid state drive (SSD), according to an embodiment of the inventive concept.

FIG. 27 is a block diagram of a memory system applied to an SSD, according to an embodiment of the inventive concept.

Referring to FIG. 27, an SSD system 4000 comprises a host 4100 and an SSD 4200. SSD 4200 transmits and receives a signal to and from the host 4100 through a signal connector 4211, and receives power through a power connector 4221. SSD 4200 comprises an SSD controller 4210, an auxiliary power source 422, and a plurality of memory devices 4230 through 4250. Here, SSD controller 4210 may be memory controller 10 or 1100 of FIG. 1 or 9.

Figure 28:
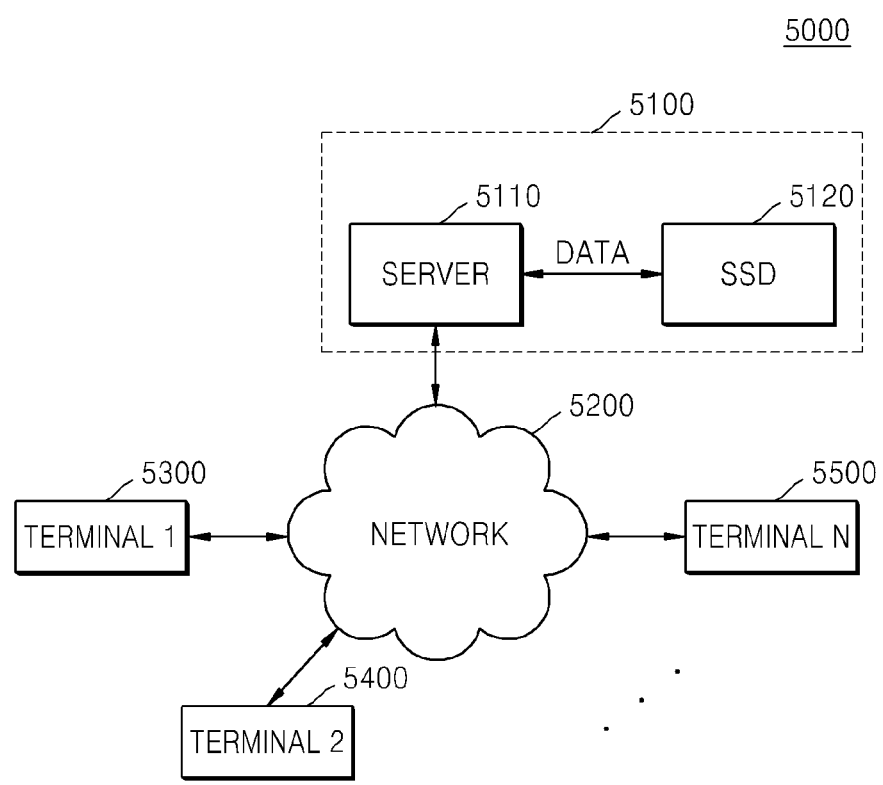
FIG. 28 is a block diagram of a server system including the SSD of FIG. 27, and a network system, according to an embodiment of the inventive concept.

FIG. 28 is a block diagram of a server system 5100 comprising the SSD 4210 of FIG. 27, and a network system 5000.

Referring to FIG. 28, network system 5000 comprises server system 5100 and a plurality of terminals 5300 through 5500, which are connected through a network 5200. Server system 5100 comprises a server 5110 for processing requests received from the terminals 5300 through 5500 connected to the network 5200, and an SSD 5120 for storing data corresponding to the requests received from the terminals 5300 through 5500. Here, SSD 5120 may be SSD 5200 of FIG. 27.

Meanwhile, a flash memory system described above may be mounted using a package of various shapes or types. For example, it may be mounted using a package on package (PoP), ball grid arrays (BGAs), chip scale packages (CSPs), a plastic leaded chip carrier (PLCC), a plastic dual in-line package (PDIP), a die in waffle pack, a die in wafer form, a chip on board (COB), a ceramic dual in-line package (CERDIP), a plastic metric quad flat pack (MQFP), a thin quad flat pack (TQFP), a small outline integrated chip (SOIC), a shrink small outline package (SSOP), a thin small outline package (TSOP), a thin quad flat pack (TQFP), a system in package (SIP), a multi chip package (MCP), a wafer-level fabricated package (WFP), or a wafer-level processed stack package (WSP).

The foregoing is illustrative of embodiments and is not to be construed as limiting thereof. Although a few embodiments have been described, those skilled in the art will readily appreciate that many modifications are possible in the embodiments without departing from the scope of the inventive concept as defined in the claims.

What is claimed is:

1. A method of estimating a deterioration state of a memory device, comprising:
    reading data from selected memory cells connected to a selected wordline of a memory cell array by applying to the selected wordline a plurality of distinct read voltages having values corresponding to at least one valley of threshold voltage distributions of the selected memory cells;
    generating quality estimation information indicating states of the threshold voltage distributions using the data read from the selected memory cells by
        determining, based on the data read from the selected memory cells by applying each of the plurality of read voltages, a number of memory cells in each of multiple threshold voltage sections defined by the plurality of read voltages; and
        determining, based on the determined number of memory cells according to the threshold voltage sections, first type quality estimation information indicating read voltage displacement and a threshold voltage distribution width level; and
    determining a deterioration state of a storage area including the selected memory cells based on the generated quality estimation information.

2. The method of claim 1, wherein the plurality of read voltages comprise read voltages set to generate soft-decision data.

3. The method of claim 1, wherein the plurality of read voltages comprise a first read voltage for hard-decision, a second read voltage decreased by an initially set first offset voltage based on the first read voltage, and a third read voltage increased by an initially set second offset voltage based on the first read voltage.

4. The method of claim 1, wherein determining of the deterioration state comprises:
    determining a first decision reference value in a threshold voltage distribution level with respect to read voltage displacement in the quality estimation information;
    comparing the first decision reference value and the threshold voltage distribution level in the quality estimation information; and
    if the threshold voltage distribution level in the quality estimation information is higher than the first decision reference value based on a comparing result, determining the deterioration state to be a first deterioration state.

5. The method of claim 1, wherein determining the deterioration state comprises:
    comparing the quality estimation information and an initially set second decision reference value; and
    if the quality estimation information is higher than the second decision reference value based on a comparing result, determining the deterioration state to be a second deterioration state,
    wherein the quality estimation information comprises second type quality estimation information generated based on a number of bits corresponding to a memory cell having a threshold voltage not included in a section between a minimum level and a maximum level of the plurality of read voltages from among the bits whose errors are corrected based on the soft-decision decoding process.

6. A method of estimating a deterioration state of a memory device, comprising:
    reading data from selected memory cells connected to a selected wordline of a memory cell array by applying to the selected wordline a plurality of distinct read voltages having values corresponding to at least one valley of threshold voltage distributions of the selected memory cells;
    generating quality estimation information indicating states of the threshold voltage distributions using the data read from the selected memory cells; and
    determining a deterioration state of a storage area including the selected memory cells based on the generated quality estimation information,
    wherein generating the quality estimation information comprises:
    generating first information indicating a number of memory cells having a threshold voltage in a section between a first read voltage for hard-decision and a second read voltage decreased by an initially set first offset voltage based on the first read voltage;
    generating second information indicating a number of memory cells having a threshold voltage in a section between the first read voltage and a third read voltage increased by an initially set second offset voltage based on the first read voltage; and
    determining, based on the first and second information, first type quality estimation information indicating read voltage displacement and a threshold voltage distribution width level.

7. The method of claim 6, wherein determining the first type quality estimation information comprises:
    generating third information by determining a difference between the first information and the second information; and
    generating fourth information by determining a sum of the first information and the second information,
    wherein the first type quality estimation information comprises the third information and the fourth information.

8. A method of estimating a deterioration state of a memory device, comprising:
    reading data from selected memory cells connected to a selected wordline of a memory cell array by applying to the selected wordline a plurality of distinct read voltages having values corresponding to at least one valley of threshold voltage distributions of the selected memory cells;
    generating quality estimation information indicating states of the threshold voltage distributions using the data read from the selected memory cells; and
    determining a deterioration state of a storage area including the selected memory cells based on the generated quality estimation information,
    wherein generating of the quality estimation information comprises:
    performing a soft-decision decoding process using the data read from the selected wordline;
    determining a reliability level of each of bits whose errors are corrected based on a result of performing the soft-decision decoding process; and
    determining second type quality estimation information based on the determined reliability level.

9. The method of claim 8, wherein performing of the soft-decision decoding process comprises:
    generating soft-decision data using hard-decision data and reliability data read from the selected wordline; and performing an error detecting and correcting process based on the soft-decision data.

10. The method of claim 8, wherein determining of the reliability level comprises:
    detecting an error-corrected bit by comparing data on which the soft-decision decoding process is performed and hard-decision data; and
    determining a strong error bit based on the reliability data corresponding to the detected error-corrected bit,
    wherein, where a bit corresponding to a memory cell having a threshold voltage not in a section between a minimum level and a maximum level of the plurality of read voltages is error-corrected, the bit is determined to be a strong error bit.

11. The method of claim 8, wherein determining the second type quality estimation information comprises determining the second type quality estimation information based on a number of bits corresponding to a memory cell having a threshold voltage not in a section between a minimum level and a maximum level of the plurality of read voltages from among the bits whose errors are corrected based on the soft-decision decoding process.

12. The method of claim 11, wherein the second type quality estimation information comprises information regarding a ratio of a number of the bits whose errors are corrected based on the soft-decision decoding process to the number of bits corresponding to the memory cell having the threshold voltage not included in the section between the minimum level and the maximum level of the plurality of read voltages from among the bits whose errors are corrected.

13. A method of performing wear leveling in a memory system, comprising:
    determining a number of memory cells in each of multiple threshold voltage sections defined by a plurality of read voltages set to generate soft-decision data;
    where a threshold voltage distribution width level according to read voltage displacement determined using the determined number of memory cells is higher than a first decision reference value, determining a deterioration state of the memory cells to be a first deterioration state;
    detecting, based on a result of a decoding process using the soft-decision data, bits whose errors are corrected in the threshold voltage sections defined by the plurality of read voltages;
    where a number of bits whose errors are corrected corresponding to a memory cell having a threshold voltage not included in a section between a minimum level and a maximum level of the plurality of read voltages from among the detected bits whose errors are corrected is higher than a second decision reference value, determining the deterioration state to be a second deterioration state; and
    transferring data stored in a storage area whose deterioration state is determined to be at least one of the first and second deterioration states to another storage area whose deterioration state is lower than a threshold level.

14. The method of claim 13, wherein determining the deterioration state to be the first deterioration state comprises:
    determining, based on the determined number of memory cells according to the threshold voltage sections, first type quality estimation information indicating read voltage displacement and a threshold voltage distribution width level;
    determining a first decision reference value in a threshold voltage distribution level corresponding to the read voltage displacement in the first type quality estimation information;
    comparing the first decision reference value and the threshold voltage distribution level in the first type quality estimation information; and
    where the threshold voltage distribution level in the first type quality estimation information is higher than the first decision reference value based on a result of the comparing, determining a deterioration state to be a first deterioration state.

15. A method of performing wear leveling in a memory system, comprising:
    reading data from a memory device by applying to selected memory cells in a designated storage area a plurality of read voltages set to generate soft-decision data;
    generating first type quality estimation information using the data read from the memory device;
    determining a first decision reference value based on the first type quality estimation information;
    comparing information in the first type quality estimation information with the first decision reference value;
    where it is determined that the information in the first type quality estimation information is higher than the first decision reference value, determining a deterioration state of the designated storage area to be a first deterioration state, and otherwise generating second type quality estimation information using the data read from the memory device, comparing the second type quality estimation information with a second decision reference value, and upon determining that the second type quality estimation information is higher than the second decision reference value, determining the deterioration state of the designated storage area to be the second deterioration state; and
    transferring the data stored in the designated storage area determined to be in the first or second deterioration state to another storage area of the memory device having a deterioration state lower than a threshold level.

16. The method of claim 15, wherein generating the first type quality estimation information comprises:
    determining, based on the data read from the memory device, a number of memory cells in each of multiple threshold voltage sections defined by the plurality of read voltages; and
    determining, based on the determined number of memory cells, the first type quality estimation information.

17. The method of claim 15, wherein generating the first type quality estimation information comprises:
    generating first information indicating a number of memory cells having a threshold voltage in a section between a first read voltage for hard-decision and a second read voltage decreased by an initially set first offset voltage based on the first read voltage;
    generating second information indicating a number of memory cells having a threshold voltage in a section between the first read voltage and a third read voltage increased by an initially set second offset voltage based on the first read voltage; and
    determining, based on the first and second information, the first type quality estimation information.

18. The method of claim 17, wherein determining the first type quality estimation information further comprises:
    generating third information by determining a difference between the first information and the second information; and
    generating fourth information by determining a sum of the first information and the second information,
    wherein the first type quality estimation information comprises the third information and the fourth information.

19. The method of claim 15, wherein generating the second type quality estimation information comprises:
- performing error detection and correction using hard-decision data and reliability data read from the memory device;
- determining a reliability level of bits corrected by the error correction; and
- calculating the second type quality estimation information based on the determined reliability level.

\* \* \* \* \*